(12) United States Patent
Chhun et al.

(10) Patent No.: US 10,892,291 B2
(45) Date of Patent: Jan. 12, 2021

(54) BONDING PAD ARCHITECTURE USING CAPACITIVE DEEP TRENCH ISOLATION (CDTI) STRUCTURES FOR ELECTRICAL CONNECTION

(71) Applicant: STMicroelectronics (Crolles 2) SAS, Crolles (FR)

(72) Inventors: Sonarith Chhun, Pontcharra (FR); Gregory Imbert, Revel (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/285,306

(22) Filed: Feb. 26, 2019

(65) Prior Publication Data

US 2019/0189654 A1 Jun. 20, 2019

Related U.S. Application Data

(62) Division of application No. 15/707,009, filed on Sep. 18, 2017, now abandoned.

(51) Int. Cl.
*H01L 27/146* (2006.01)
*H01L 21/84* (2006.01)
(Continued)

(52) U.S. Cl.
CPC ...... *H01L 27/1464* (2013.01); *H01L 21/3065* (2013.01); *H01L 21/76224* (2013.01); *H01L 21/84* (2013.01); *H01L 23/481* (2013.01); *H01L 23/552* (2013.01); *H01L 24/00* (2013.01); *H01L 24/05* (2013.01); *H01L 27/0629* (2013.01); *H01L 27/1203* (2013.01); *H01L 27/1463* (2013.01); *H01L 27/1469* (2013.01); *H01L 27/14634* (2013.01); *H01L 27/14636* (2013.01); *H01L 29/945* (2013.01);
(Continued)

(58) Field of Classification Search
CPC ..... H01L 21/76224; H01L 2225/06541; H01L 27/14636; H01L 21/76229; H01L 23/5222–5225; H01L 21/823481; H01L 21/823878; H01L 23/49827; H01L 23/5226; H01L 21/76898; H01L 23/481
See application file for complete search history.

(56) References Cited

U.S. PATENT DOCUMENTS

2010/0246152 A1 9/2010 Lin et al.
2013/0181349 A1 7/2013 Koyama et al.
(Continued)

*Primary Examiner* — Nelson Garces
(74) *Attorney, Agent, or Firm* — Crowe & Dunlevy

(57) ABSTRACT

A semiconductor substrate has a back side surface and a front side surface. Metallization levels are provide at the front side surface. Capacitive deep trench isolation structures extend completely through the semiconductor substrate from the front side surface to the back side surface. Each capacitive deep trench isolation structure includes a conductive region insulated from the semiconductor substrate by an insulating liner. The conductive regions at first ends of the plurality of capacitive deep trench isolation structures are electrically connected to a first metallization level by electrical contacts. A bonding pad structure is located at the back side surface of the semiconductor substrate in direct physical and electrical connection to the conductive regions at second ends of the capacitive deep trench isolation structures.

16 Claims, 21 Drawing Sheets

(51) Int. Cl.
*H01L 23/48* (2006.01)
*H01L 21/762* (2006.01)
*H01L 27/06* (2006.01)
*H01L 27/12* (2006.01)
*H01L 21/3065* (2006.01)
*H01L 23/00* (2006.01)
*H01L 23/552* (2006.01)
*H01L 29/94* (2006.01)

(52) U.S. Cl.
CPC ......... *H01L 2224/0509* (2013.01); *H01L 2224/05087* (2013.01); *H01L 2224/05088* (2013.01); *H01L 2224/05093* (2013.01); *H01L 2224/05166* (2013.01); *H01L 2224/05181* (2013.01); *H01L 2224/05624* (2013.01); *H01L 2225/06541* (2013.01)

(56) References Cited

U.S. PATENT DOCUMENTS

2014/0312491 A1* 10/2014 Jin .................. H01L 25/0657
257/737
2016/0379962 A1 12/2016 Huang et al.

* cited by examiner

BONDING PAD ARCHITECTURE USING CAPACITIVE DEEP TRENCH ISOLATION (CDTI) STRUCTURES FOR ELECTRICAL CONNECTION

CROSS REFERENCE TO RELATED APPLICATION

This application is a divisional application from U.S. application for patent Ser. No. 15/707,009 filed Sep. 18, 2017, the disclosure of which is incorporated by reference.

TECHNICAL FIELD

The present disclosure generally relates to the formation of bonding pads for integrated circuits and, in particular, to the formation of bonding pads on a back side of a semiconductor substrate for electrical connection to front side metallization through capacitive deep trench isolation (CDTI) structures.

BACKGROUND

FIG. 1 shows a cross-section of a conventional integrated circuit device. The device includes a semiconductor substrate 10 having a back side surface 12 and a front side surface 14. Integrated circuits such as transistors 16 are formed at the front side surface 14 in an active region of the substrate 10. A dielectric layer 20, sometimes referred to as a premetallization dielectric (PMD) layer, covers the front side surface 14 and the integrated circuits. Metal contacts 22 extend through the dielectric layer 20 to make electrical contact with the integrated circuits; such as, for example, to contact polysilicon lines (like the gate G) extending over the front side surface and doped diffusion regions (like the source S and drain D) formed in the substrate 10 at the front side surface. A plurality of metallization levels M1-Mn are formed over the dielectric layer 20. The metallization levels M1-Mn include metal lines 24 and metal vias 26 that are electrically connected to the contacts 22 and configured to make electrical interconnections. A bonding pad 30 is formed over the last metallization level Mn and is in electrical connection to the electrical interconnections of the metallization levels.

It is also known in the art to isolate active regions of the substrate 10 using shallow trench isolation (STI) structures 40. An example of this is shown in FIG. 1 with respect to the active region for the transistor 16. It is also known in the art to isolate active regions of the substrate using deep trench isolation (DTI) structures 42. An example of this is shown in FIG. 1 with respect to region 44 (for simplifying the illustration, the integrated circuits present within region 44 are not explicitly shown). It is further known in the art to isolate active regions of the substrate using capacitive deep trench isolation (CDTI) structures 46 (also known in the art as metal-filled DTI). An example of this is shown in FIG. 1 with respect to region 48 (for simplifying the illustration, the integrated circuits present within region 48 are not explicitly shown). The CDTI differs from the DTI in that the CDTI includes a conductive region 50 made of any suitable conductive material (such as doped polysilicon or a metal) that is insulated from the substrate 10 by an insulating liner 52. The conductive region 50 may be electrically connected through a contact 22 to the metal lines and vias of the metallization levels M1-Mn. Through this electrical connection, the conductive region may be biased by a desired voltage potential. The DTI and CDTI may each have depths which extend from the front side surface 14 to the back side surface 12 of the substrate 10.

In an implementation, the region 48 delimited by the CDTI structures 46 may include a photosensitive circuit such as a photodiode. In the illustration of FIG. 1, that photodiode receives light through the back side surface 12. This technology is known to those skilled in the art as back side illumination (BSI). A suitable filter 70 and lens 72 may be positioned at the back side surface 12 in alignment with the region 48 to direct light towards the photosensitive circuit.

SUMMARY

In an embodiment, an integrated circuit comprises: a semiconductor substrate having a back side surface and a front side surface; a plurality of metallization levels including metal lines and vias; a plurality of capacitive deep trench isolation structures, wherein each capacitive deep trench isolation structure extends completely through the semiconductor substrate from the front side surface to the back side surface, each capacitive deep trench isolation structure comprising a conductive region insulated from the semiconductor substrate by an insulating liner; electrical contacts between the conductive regions at first ends of the plurality of capacitive deep trench isolation structures to a first metallization level of said plurality of metallization levels; and a bonding pad structure located at the back side surface of the semiconductor substrate, wherein the bonding pad structure is directly physically and electrically connected to the conductive regions at second ends of the plurality of capacitive deep trench isolation structures.

In an embodiment, a method comprises: forming a semiconductor substrate having a back side surface and a front side surface and that includes a plurality of capacitive deep trench isolation structures extending completely through the semiconductor substrate from the front side surface to the back side surface, each capacitive deep trench isolation structure comprising a conductive region insulated from the semiconductor substrate by an insulating liner; providing a metallization structure electrically connected to first ends of the plurality of capacitive deep trench isolation structures; and forming a bonding pad structure located at the back side surface of the semiconductor substrate, wherein the bonding pad structure is directly physically and electrically connected to the conductive regions at second ends of the plurality of capacitive deep trench isolation structures.

The method for forming the bonding pad structure may comprise: recessing the back side surface of the semiconductor substrate to expose ends of the plurality of capacitive deep trench isolation structures; depositing a conformal layer of a dielectric material on the recessed back side surface and exposed ends of the plurality of capacitive deep trench isolation structures; depositing a conformal layer of an oxide material on the conformal layer of the dielectric material; planarizing the oxide material layer; opening an aperture extending through at least the dielectric material which extends on end surfaces of the plurality of capacitive deep trench isolation structures to expose the conductive regions at second ends of the plurality of capacitive deep trench isolation structures; and depositing one or more metal materials forming the bonding pad structure within said aperture.

The method for forming the bonding pad structure may alternatively comprise: depositing a conformal layer of a dielectric material on the back side surface; depositing a conformal layer of an oxide material on the conformal layer of the dielectric material; opening an aperture extending through the both the oxide material layer and the dielectric material layer to expose the conductive regions at second ends of the plurality of capacitive deep trench isolation structures; and depositing one or more metal materials forming the bonding pad structure within said aperture.

The method for forming the bonding pad structure may alternatively comprise: depositing a conformal layer of a dielectric material on the back side surface; depositing a first conformal layer of an oxide material on the conformal layer of the dielectric material; opening a first aperture extending through the both the first oxide material layer and the dielectric material layer to expose the conductive regions at second ends of the plurality of capacitive deep trench isolation structures; depositing a first metal liner within the first aperture; depositing a layer of tungsten on the first metal liner; depositing a second conformal layer of an oxide material on the layer of tungsten; opening a second aperture extending through the second oxide material layer to expose a top surface of the layer of tungsten; and depositing one or more metal materials forming the bonding pad structure within said second aperture.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION

Reference is now made to FIGS. 2A-2G which show steps of a method for making an integrated circuit device where a back side bonding pad is electrically connected to front side metallization using capacitive deep trench isolation (CDTI) structures.

Figure 1:
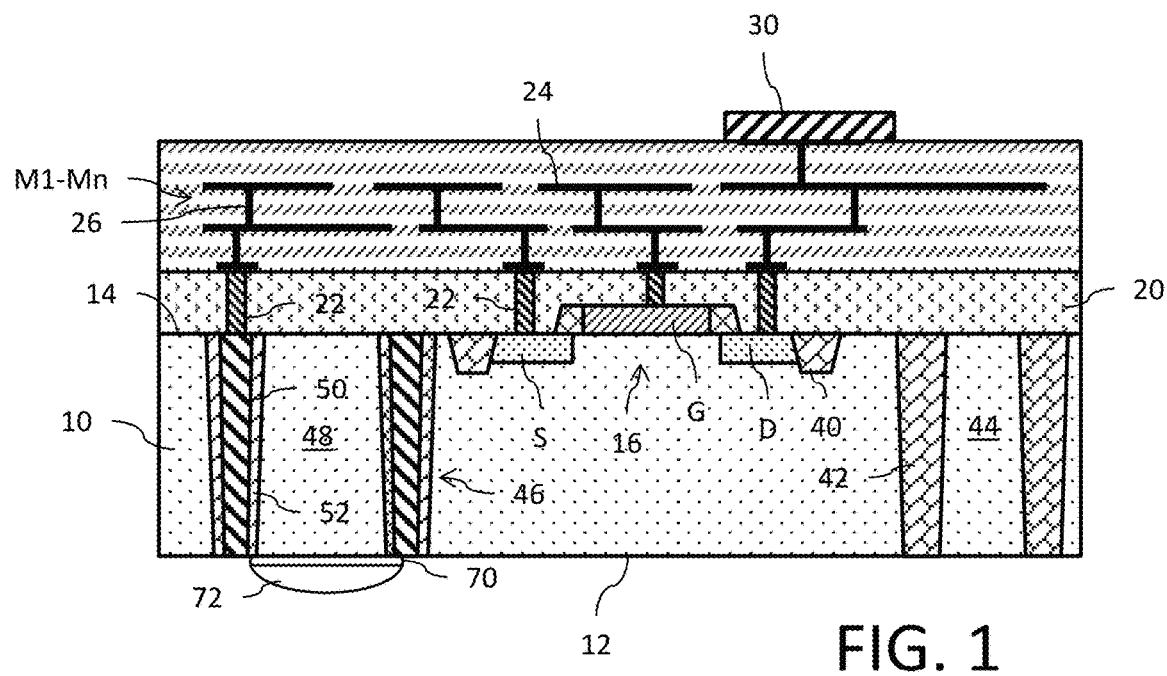
FIG. 1 is a cross-sectional view of a conventional integrated circuit device.
Figure 2A:
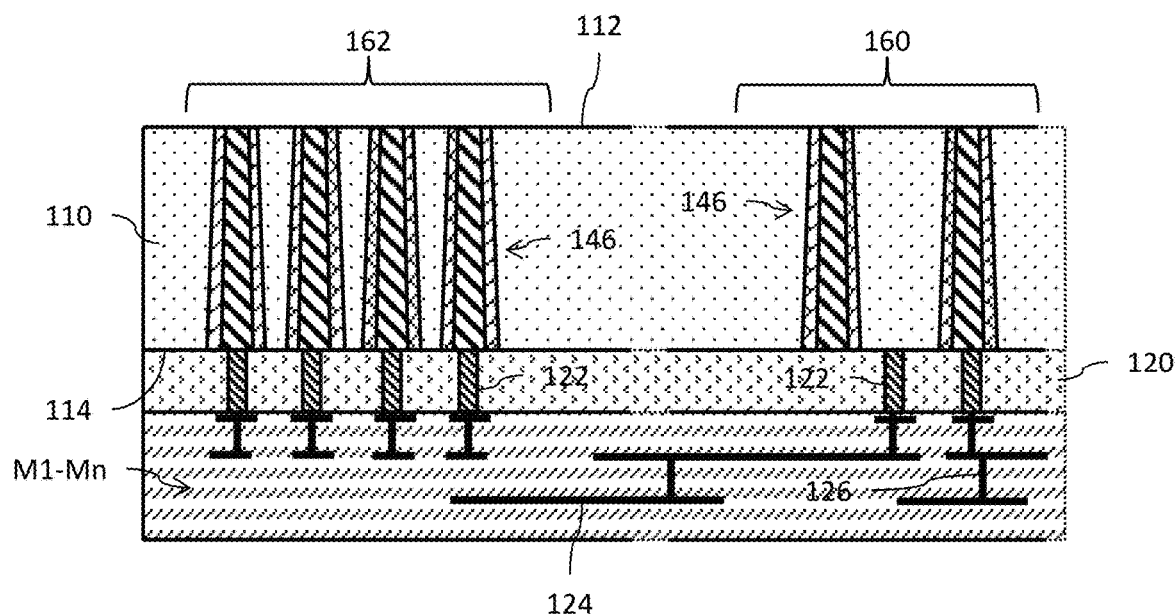
FIGS. 2A-2G show steps of a method for making an integrated circuit device where a back side bonding pad is electrically connected to front side metallization using capacitive deep trench isolation (CDTI) structures.

FIG. 2A shows a cross section of the integrated circuit device at a point in time of the device fabrication process where: integrated circuits (not explicitly shown, see FIG. 1) have already been formed in and on the front side surface 114 of a semiconductor substrate 110 in active regions; the premetallization dielectric layer 120 has already been formed; the contacts 122 extending through the layer 120 have already been formed; and the metallization levels M1-Mn have already been formed. It will be noted that the illustration in FIG. 2A is flipped upside-down with respect to the illustration of similar structures as shown in FIG. 1. The substrate 110 includes a core area 160 and a peripheral area 162 that is outside of the core area. The peripheral area 162 may, for example, be located along a peripheral edge of the substrate 110, although it will be understood that this is not a requirement. In an example implementation, the core area 160 may include photosensitive integrated circuits and the peripheral area 162 may include input/output (I/O) integrated circuits. The photosensitive integrated circuits are electrically connected to the I/O integrated circuits through the metal lines 124 and vias 126 of the metallization levels M1-Mn. Capacitive deep trench isolation (CDTI) structures 146 (also known in the art as metal-filled DTI) are used within both the core area 160 and the peripheral area 162. The CDTI structures 146 in the peripheral area 162, however, are not used to isolate an active region of the substrate 110 in which integrated circuits are formed. Rather, the CDTI structures 146 in the peripheral area 162 are used to provide an electrical connection through the substrate 110 from the front side surface 114 to the back side surface 112. The CDTI structures 146 in the peripheral area 162 may be connected, for example, to the I/O integrated circuits through the metal lines 124 and vias 126 of the metallization levels M1-Mn.

Figure 3A:
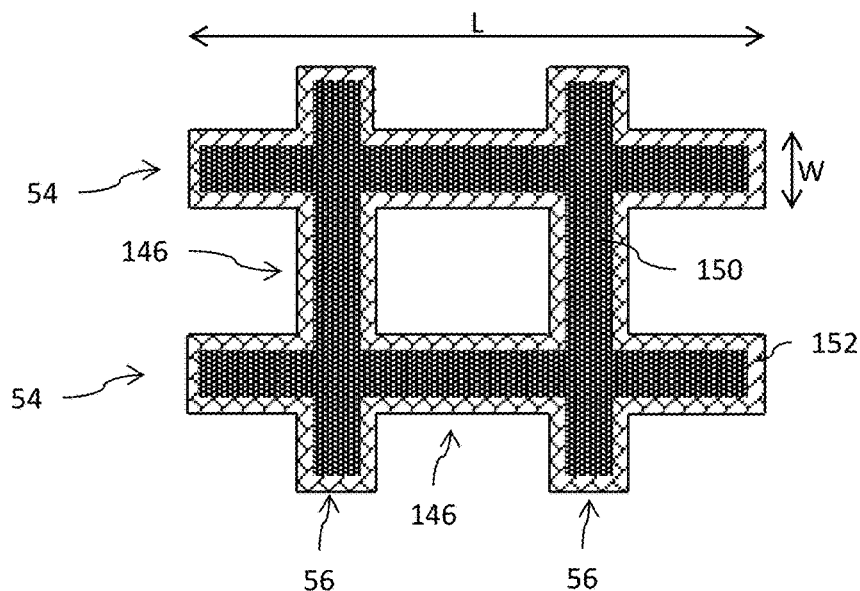
FIGS. 3A-3B are plan views showing arrangements of CDTI structures.

A plan view of the front side surface 114 in the peripheral area 162 is shown in FIG. 3A. The CDTI structures 146 are arranged in an intersecting pattern of rows 54 and columns 56. This illustration shows a 2×2 configuration of rows and columns. The CDTI structure 146 of each row 54 and column 56 is formed in a trench having a width W and a length L, where L>>W. The trenches for the rows and columns intersect in the form of a grid or mesh shape. Sidewalls of each trench are lined with an insulating material to form the insulating liner 152. The trenches are filled with a conductive material to form the conductive region 150. The conductive material for the conductive region 150 may comprise a plurality of different material layers and fillings.

Figure 3B:
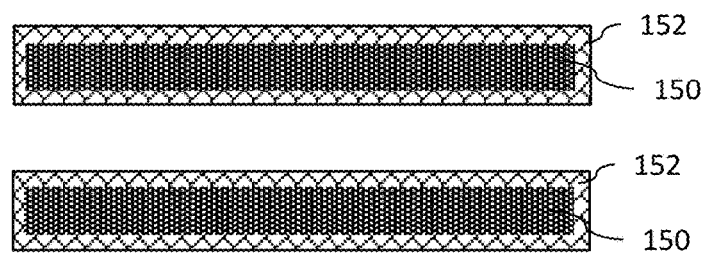

As an alternative, FIG. 3B shows an implementation where the CDTI structures 146 are arranged in a non-intersecting pattern (comprising, for example, a plurality of parallel rows or columns).

Figure 2B:
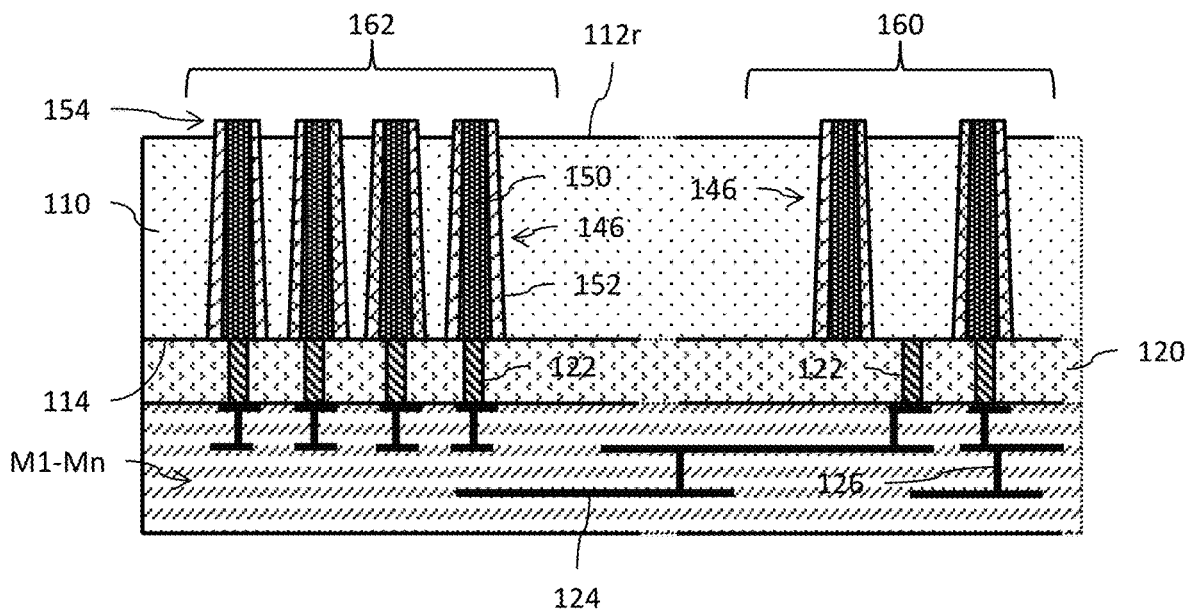

A substrate recess process is then performed on the back side surface 112. The substrate recess process is selective to remove semiconductor substrate material and reduce the thickness of the substrate 110. In an embodiment, the substrate recess process may comprise a selective (silicon) etch. The result of completion of the substrate recess process is shown in FIG. 2B. Portions 154 of the CDTI structures 146 are exposed from the recessed back side surface 112r of the substrate 110. The substrate recess process may also remove some of the insulating liner 152. An end of the conductive region 150 is exposed.

Figure 2C:
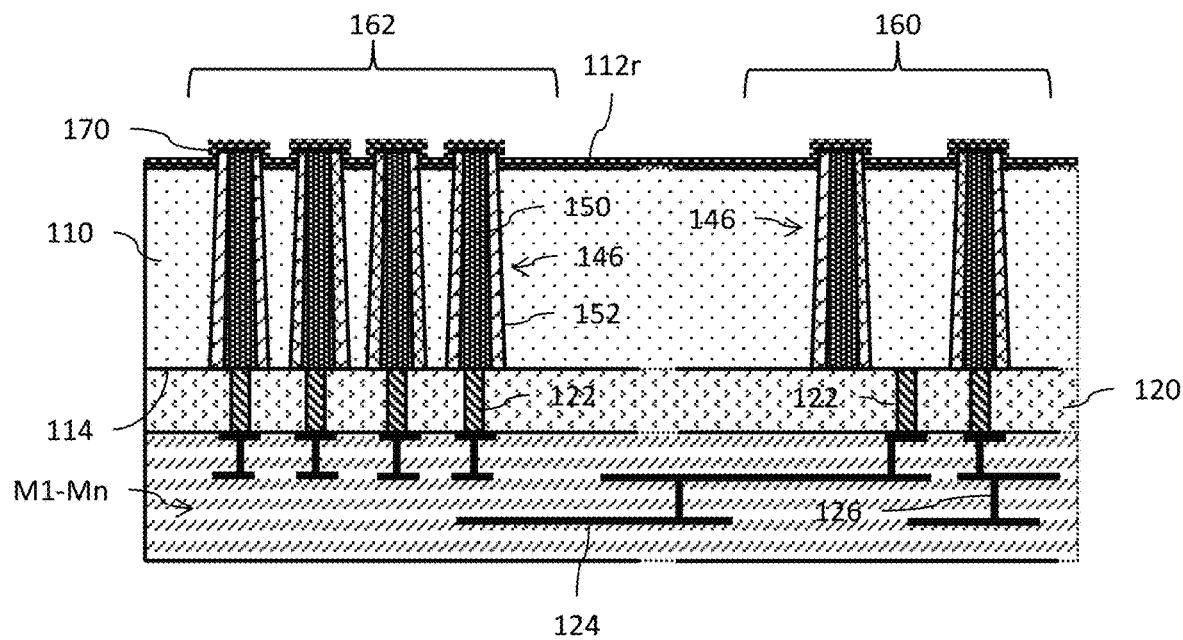

A conformal deposition is then made of a layer 170 of a high k dielectric material on the recessed back side surface 112r and the exposed portions 154 of the CDTI structures 146. As an example, k>15 and the dielectric material may comprise $HfO_2$ or $Al_2O_3$. The deposition may use an ALD or (MO)CVD process. The result is shown in FIG. 2C.

Figure 2D:
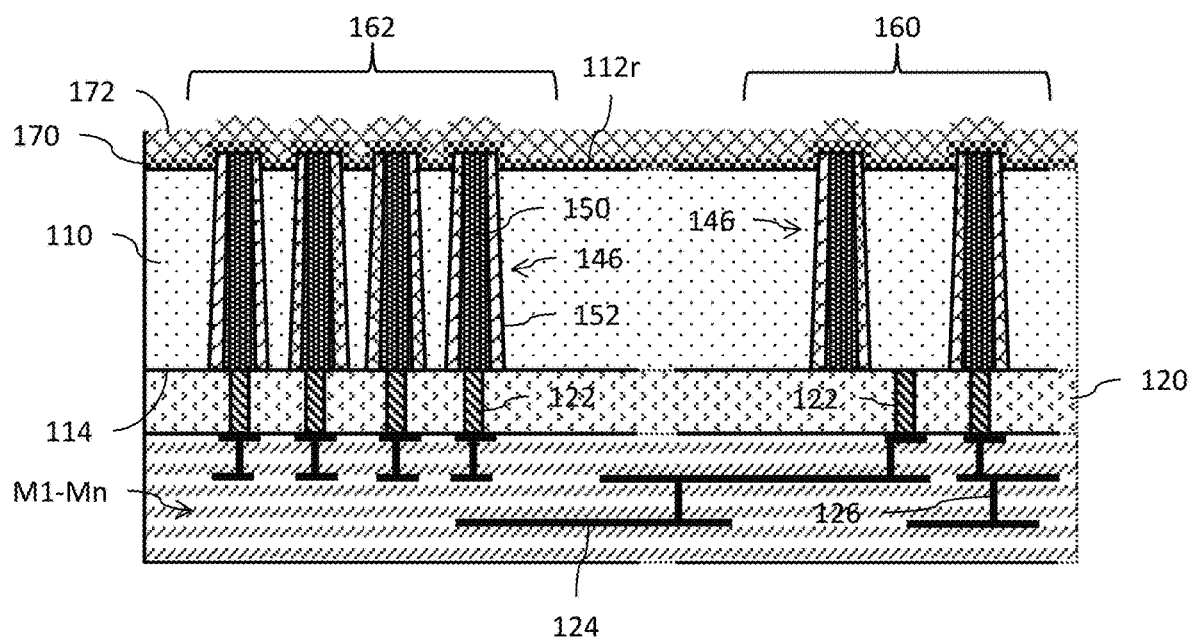

A deposition is then made of a layer 172 of an oxide material on the layer 170. As an example, the oxide material may comprise SiO2 deposited using PECVD. The result is shown in FIG. 2D.

Figure 2E:
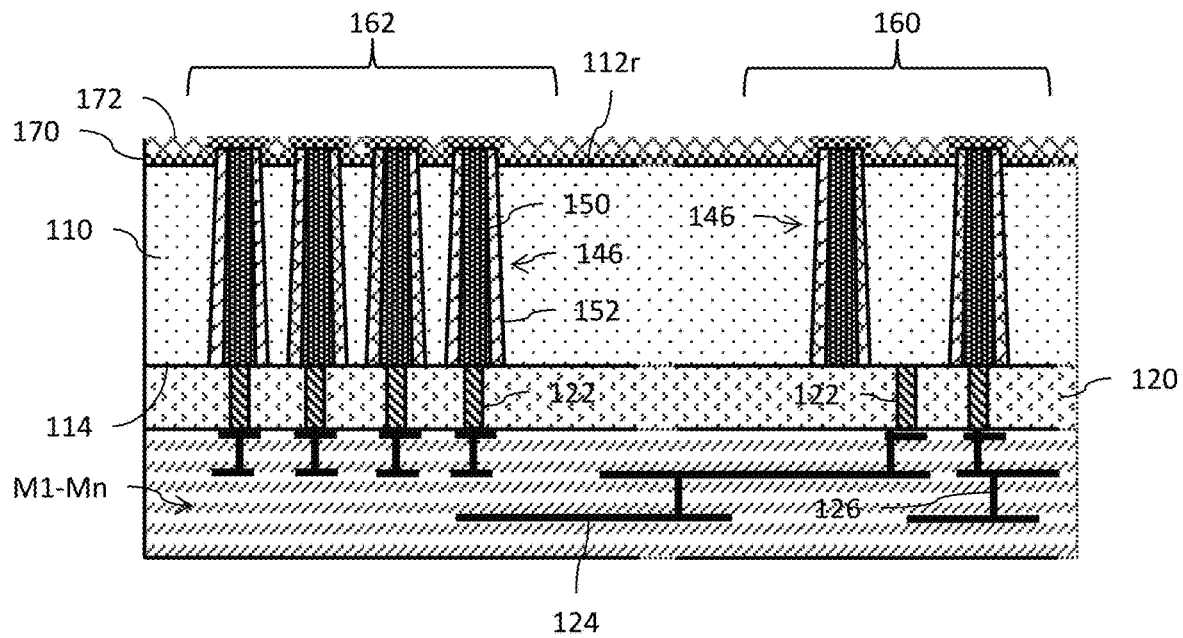

A chemical mechanical polish (CMP) is then performed on the layer 172, with that polish stopping when the layer 170 is reached. The result is shown in FIG. 2E.

Figure 2F:
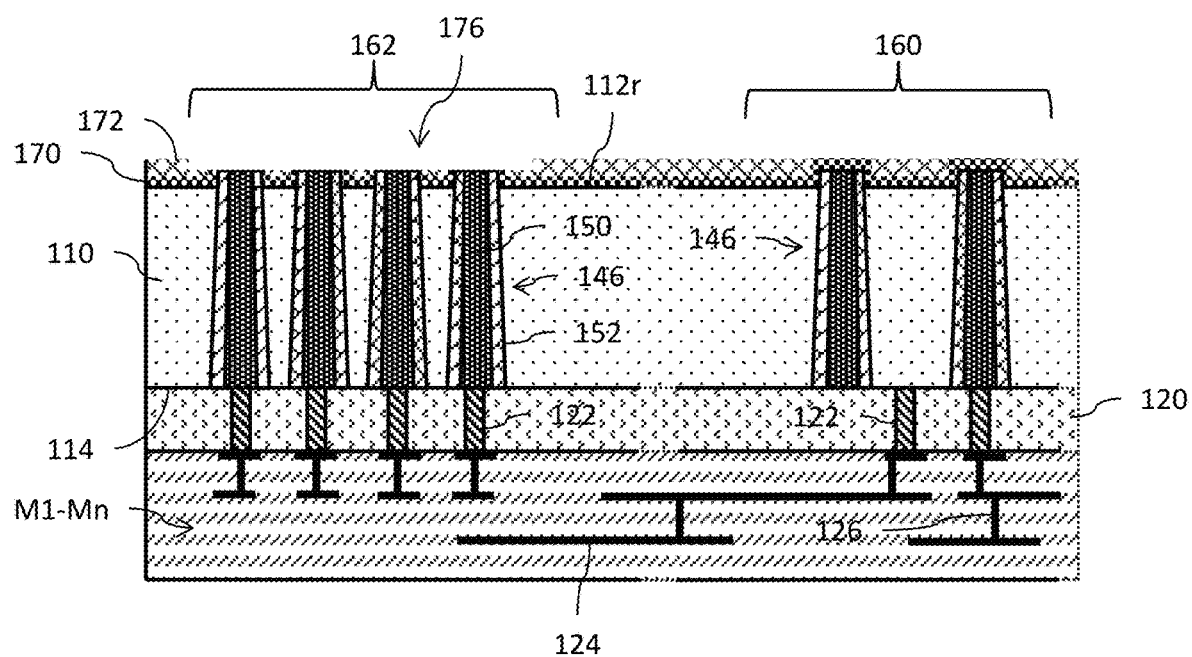

A mask (not shown) is formed on the polished surface using conventional lithographic masking techniques, and an etch is performed through the mask to open an aperture 176 in the layers 170 and 172 that exposes the ends of the portions 154 of the CDTI structures 146 in the peripheral area 162. As an example, the etch may comprise a standard dry etch process with selectivity with respect to the metal filling the CDTI. The result is shown in FIG. 2F.

Figure 2G:
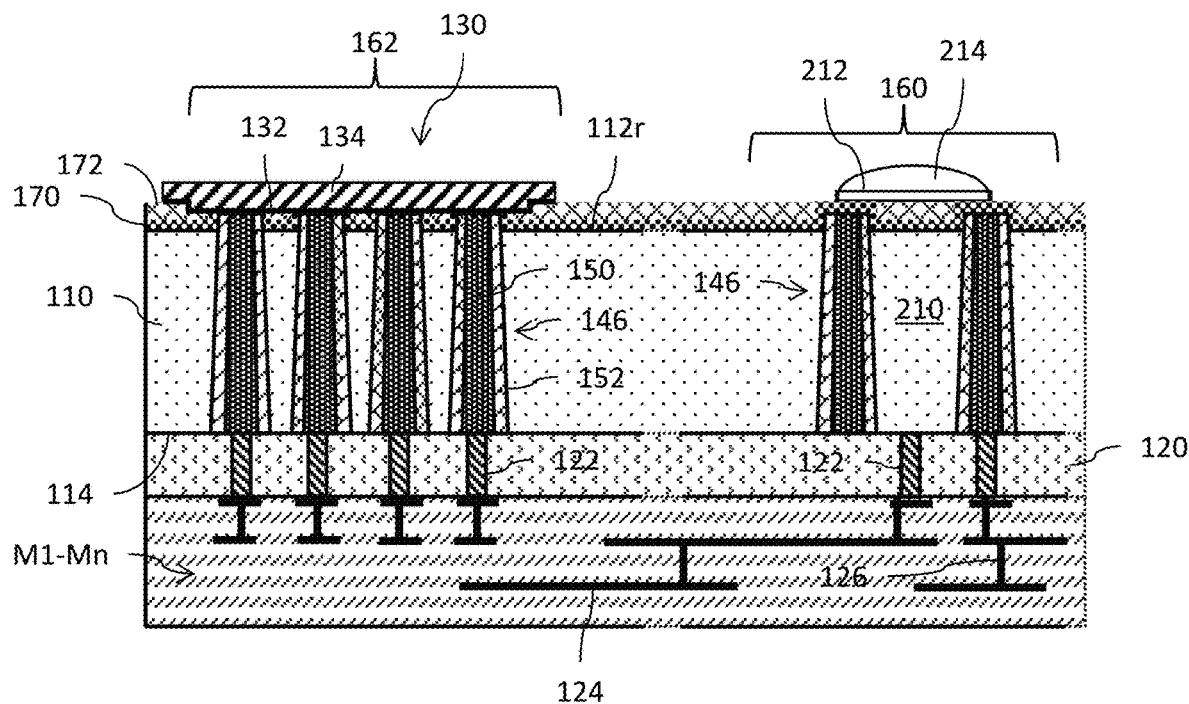

Conventional lithographic techniques are then used to pattern one or more metal material deposits to form a bonding pad 130 at least within the aperture 176. The bonding pad 130 may include a metal liner 132 and a metal block 134. The metal liner 132 may be made of Ti, TiN, Ta, or TaN. The metal block 134 may be made of aluminum. With this configuration, the bonding pad 130 can be located at the recessed back side surface 112r and be electrically connected through the CDTI structures 146 in the peripheral area 162 and the contacts 122 to the metallization layers M1-Mn. The result is shown in FIG. 2G.

Figure 4A:
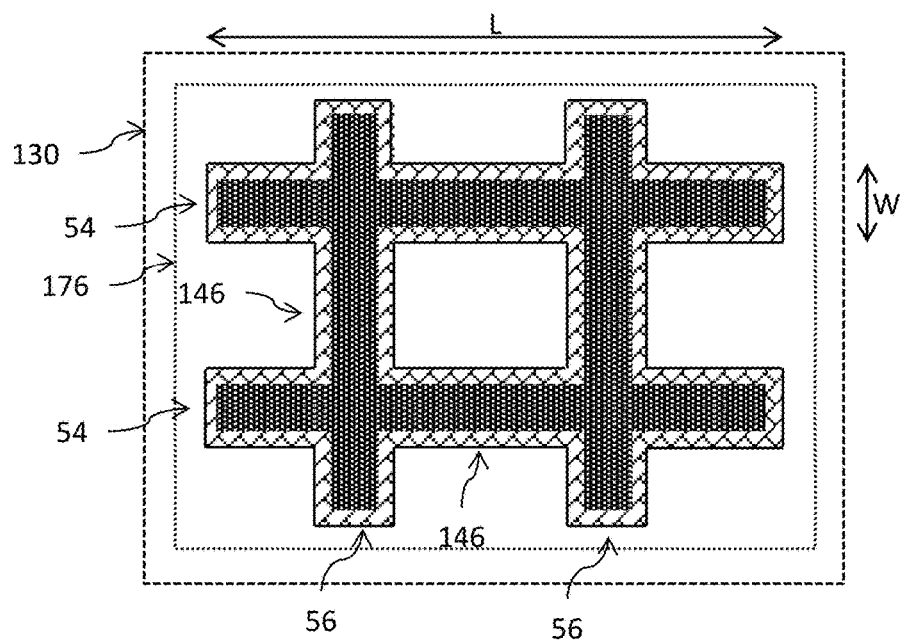
FIGS. 4A-4B are plan views showing the relationship between the bonding pad and the arrangement of CDTI structures.

FIG. 4A shows a plan view in a direction of the recessed back side surface 112r in the peripheral area 162 which illustrates the relationship between the shape and area of the aperture 176, the shape and area of the bonding pad 130 and shape and area of the intersecting pattern of rows 54 and columns 56 for the CDTI structures 146 (shown in FIG. 3A). In a preferred implementation, the area of the bonding pad 130 exceeds the area of the intersecting pattern of rows 54 and columns 56 for the CDTI structures 146. The plan view further shows the alignment of the bonding pad 130 relative to the intersecting pattern of rows 54 and columns 56.

Figure 4B:
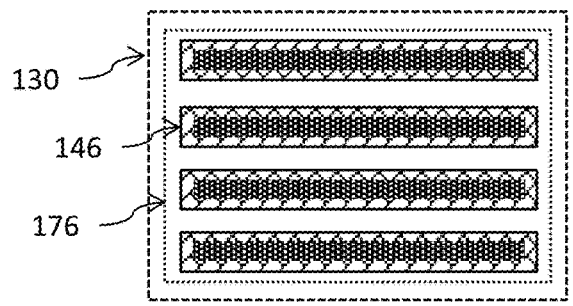

It will be noted that although an implementation utilizes intersecting rows/columns of CDTI structures 146, it is also possible to form the interconnection structure through the substrate 110 using a plurality of parallel CDTI structures (for example, only rows or only columns) as shown in FIG. 3B. FIG. 4B shows a plan view in a direction of the recessed back side surface 112r in the peripheral area 162 which illustrates the relationship between the shape and area of the aperture 176, the shape and area of the bonding pad 130 and shape and area of the non-intersecting pattern of CDTI structures 146 (shown in FIG. 3A). In a preferred implementation, the area of the bonding pad 130 exceeds the area of the non-intersecting pattern of CDTI structures 146. The plan view further shows the alignment of the bonding pad 130 relative to the non-intersecting pattern.

Reference is now made to FIGS. 5A-5G which show steps of a method for making an integrated circuit device where a back side bonding pad is electrically connected to front side metallization using capacitive deep trench isolation (CDTI) structures.

Figure 5A:
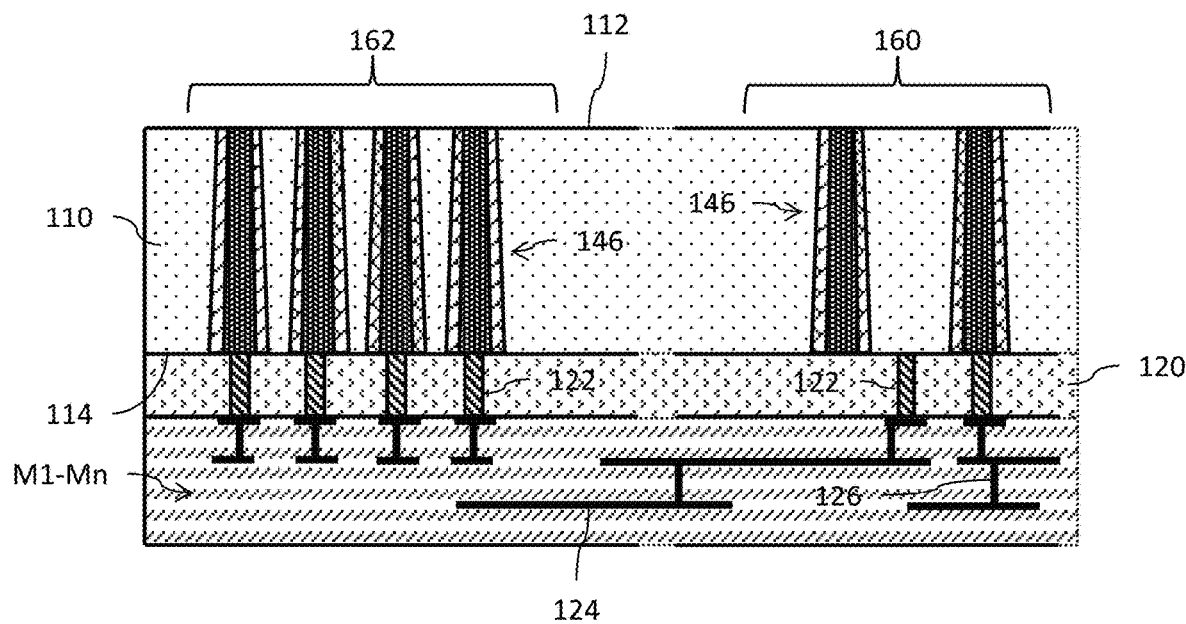
FIGS. 5A-5G show steps of a method for making an integrated circuit device where a back side bonding pad is electrically connected to front side metallization using CDTI structures.

FIG. 5A shows a cross section of the integrated circuit device at a point in time of the device fabrication process where: integrated circuits (not explicitly shown, see FIG. 1) have already been formed in and on the front side surface 114 of a semiconductor substrate 110 in active regions; the premetallization dielectric layer 120 has already been formed; the contacts 122 extending through the layer 120 have already been formed; and the metallization levels M1-Mn have already been formed. It will be noted that the illustration in FIG. 5A is flipped upside-down with respect to the illustration of similar structures as shown in FIG. 1. The substrate 110 includes a core area 160 and a peripheral area 162 that is outside of the core area. The peripheral area 162 may, for example, be located along a peripheral edge of the substrate 110, although it will be understood that this is not a requirement. In an example implementation, the core area 160 may include photosensitive integrated circuits and the peripheral area 162 may include input/output (I/O) integrated circuits. The photosensitive integrated circuits are electrically connected to the I/O integrated circuits through the metal lines 124 and vias 126 of the metallization levels M1-Mn. Capacitive deep trench isolation (CDTI) structures 146 (also known in the art as metal-filled DTI) are used within both the core area 160 and the peripheral area 162. The CDTI structures 146 in the peripheral area 162, however, are not used to isolate an active region of the substrate 110 which integrated circuits are formed. Rather, the CDTI structures 146 in the peripheral area 162 are used to provide an electrical connection through the substrate 110 from the front side surface 114 to the back side surface 112. The CDTI structures 146 in the peripheral area 162 may be connected, for example, to the I/O integrated circuits through the metal lines 124 and vias 126 of the metallization levels M1-Mn.

Plan views of the front side surface 114 in the peripheral area 162 illustrating different arrangements for the CDTI structures 146 are shown in FIGS. 3A-3B.

Figure 5B:
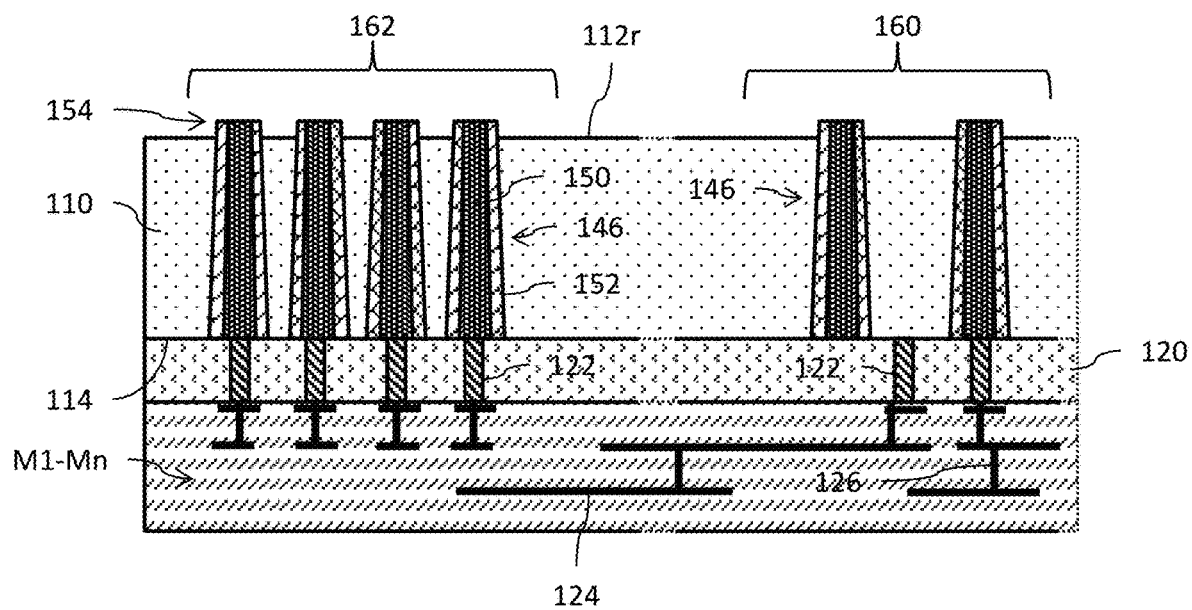

A substrate recess process is then performed on the back side surface 112. The substrate recess process is selective to remove semiconductor substrate material and reduce the thickness of the substrate 110. In an embodiment, the substrate recess process may comprise a selective (silicon) etch. The result of completion of the substrate recess process is shown in FIG. 5B. Portions 154 of the CDTI structures 146 are exposed from the recessed back side surface 112r of the substrate 110. The substrate recess process may also remove some of the insulating liner 152. An end of the conductive region 150 is exposed.

Figure 5C:
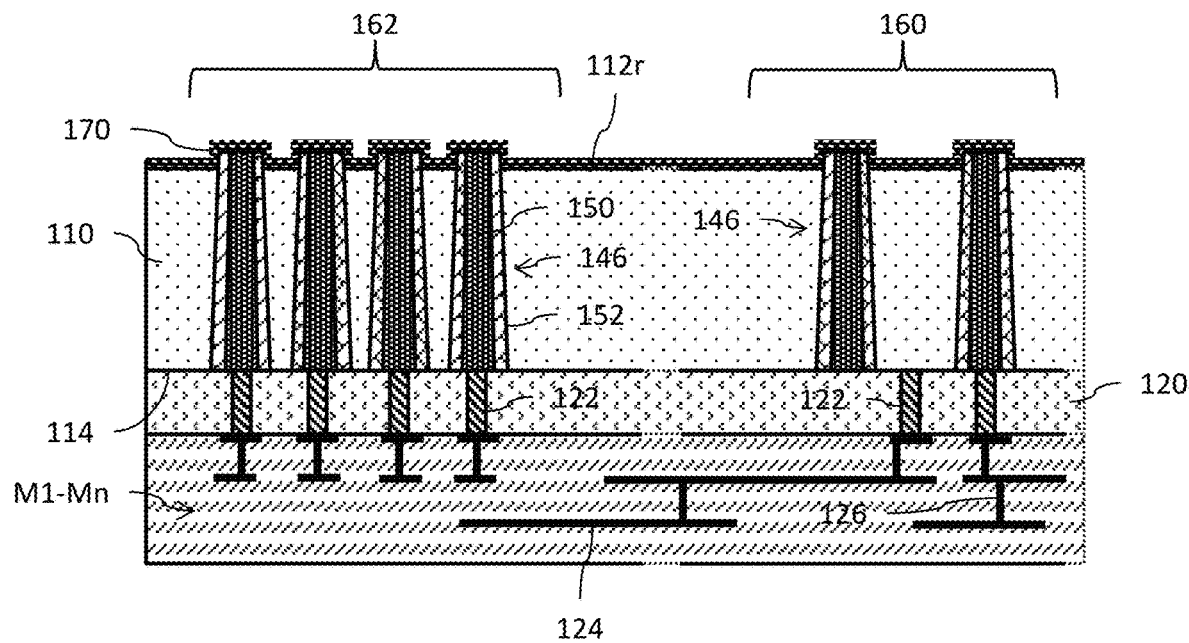

A conformal deposition is then made of a layer 170 of a high k dielectric material on the recessed back side surface 112r and the exposed portions 154 of the CDTI structures 146. As an example, k>15 and the dielectric material may comprise $HfO_2$ or $Al_2O_3$. The deposition may use an ALD or (MO)CVD process. The result is shown in FIG. 5C.

Figure 5D:
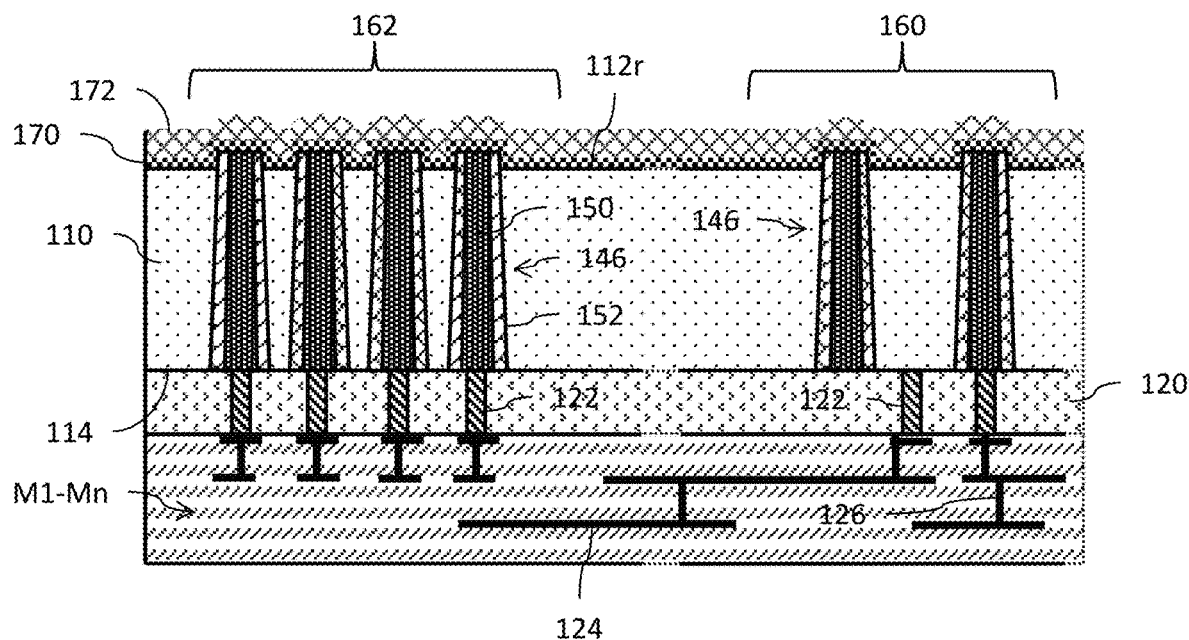

A deposition is then made of a layer 172 of an oxide material on the layer 170. As an example, the oxide material may comprise $SiO_2$ deposited using a PECVD process. The result is shown in FIG. 5D.

Figure 5E:
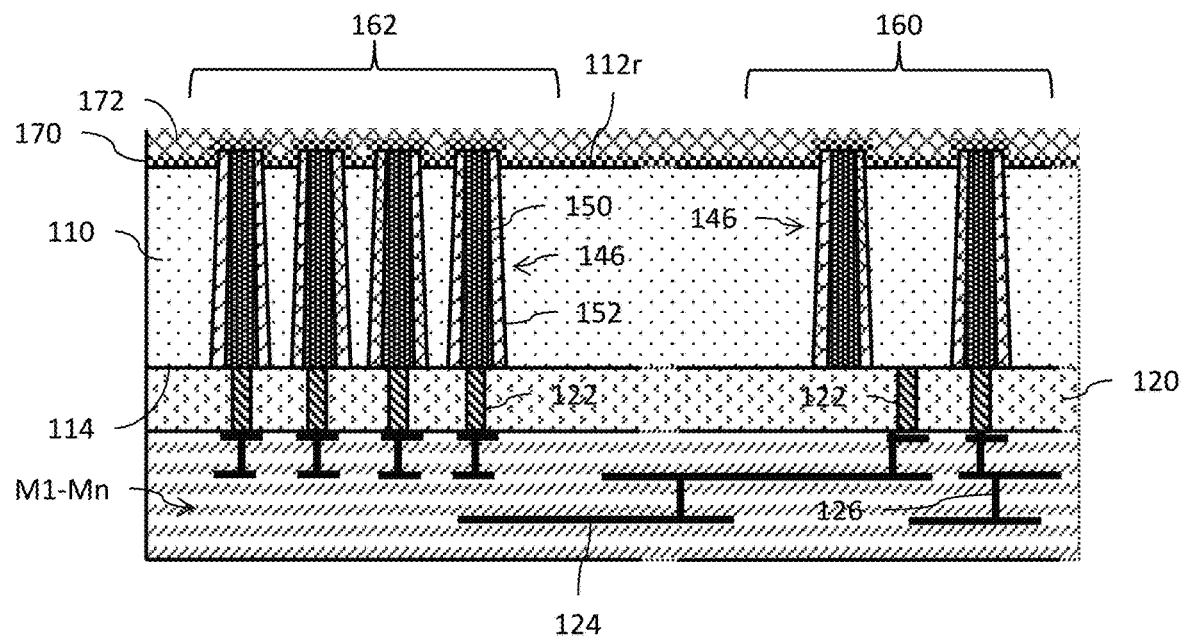

A chemical mechanical polish (CMP) is then performed on the layer 172, with that polish stopping before reaching the layer 170. The result is shown in FIG. 5E.

Figure 5F:
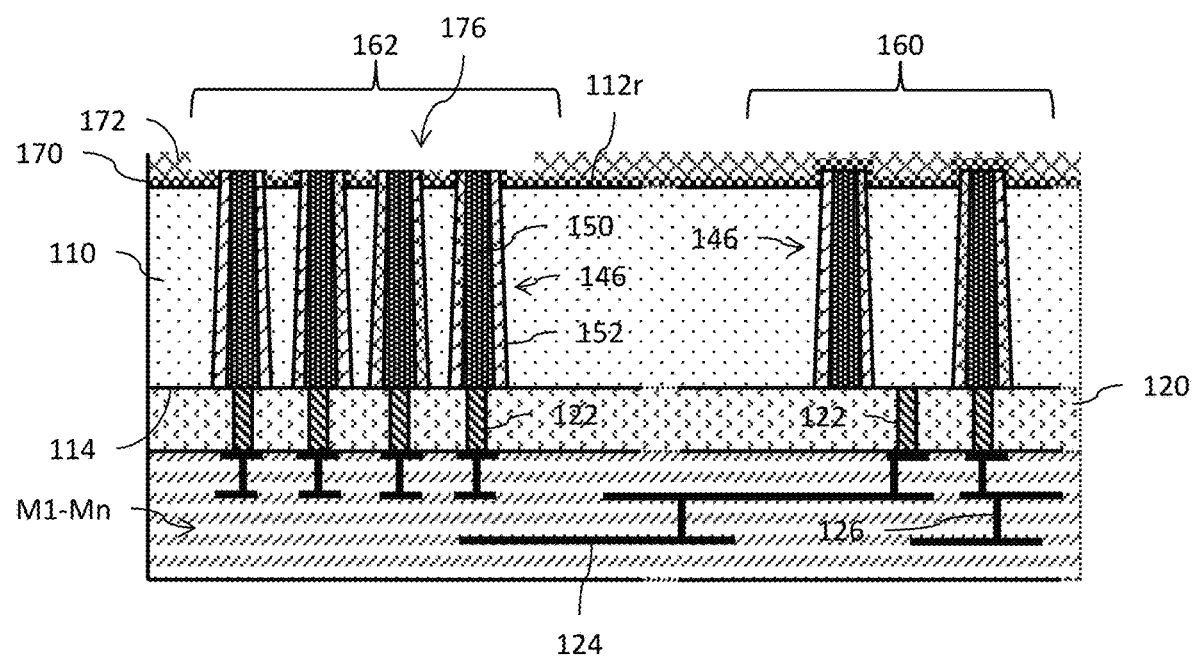

A mask (not shown) is formed on the polished surface using conventional lithographic masking techniques, and an etch is performed through the mask to open an aperture 176 in the layers 170 and 172 that exposes the ends of the portions 154 of the CDTI structures 146 in the peripheral area 162. As an example, the etch may comprise a standard dry etch process with selectivity with respect to the metal filling the CDTI. The result is shown in FIG. 5F.

Figure 5G:
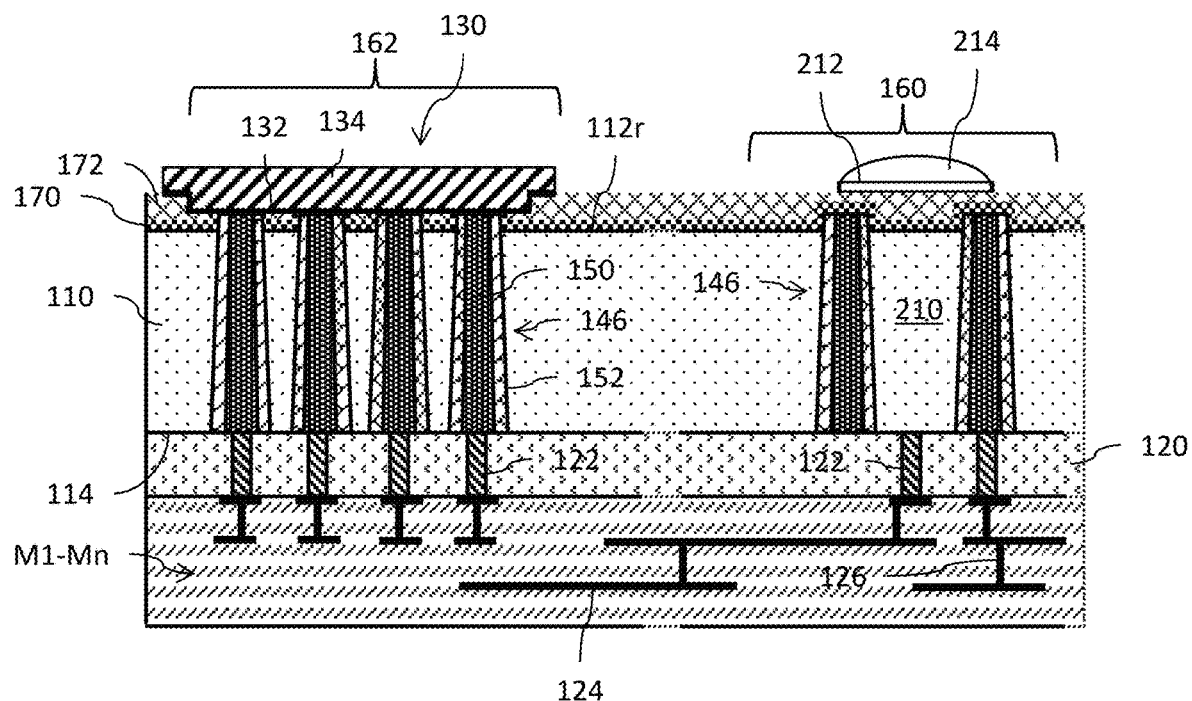

Conventional lithographic techniques are then used to pattern one or more metal material deposits to form a bonding pad 130 at least within the aperture 176. The bonding pad 130 may include a metal liner 132 and a metal block 134. The metal liner 132 may be made of Ti, TiN, Ta, or TaN. The metal block 134 may be made of aluminum. With this configuration, the bonding pad 130 can be located at the recessed back side surface 112r and be electrically connected through the CDTI structures 146 in the peripheral area 162 and the contacts 122 to the metallization layers M1-Mn. The result is shown in FIG. 5G.

FIGS. 4A-4B show plan views in a direction of the recessed back side surface 112r in the peripheral area 162 which illustrates the relationship between the shape and area of the aperture 176, the shape and area of the bonding pad 130 and the shape and area of different arrangements for the pattern for the CDTI structures 146.

Reference is now made to FIGS. 6A-6G which show steps of a method for making an integrated circuit device where a back side bonding pad is electrically connected to front side metallization using capacitive deep trench isolation (CDTI) structures.

Figure 6A:
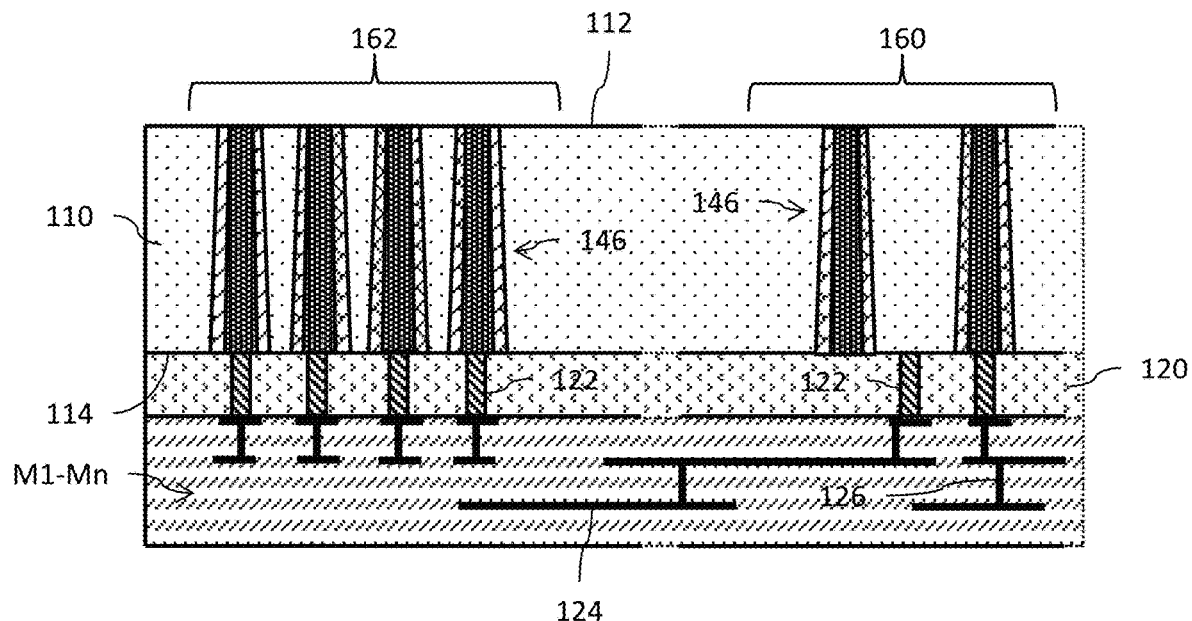
FIGS. 6A-6G show steps of a method for making an integrated circuit device where a back side bonding pad is electrically connected to front side metallization using CDTI structures.

FIG. 6A shows a cross section of the integrated circuit device at a point in time of the device fabrication process where: integrated circuits (not explicitly shown, see FIG. 1) have already been formed in and on the front side surface 114 of a semiconductor substrate 110 in active regions; the premetallization dielectric layer 120 has already been formed; the contacts 122 extending through the layer 120 have already been formed; and the metallization levels M1-Mn have already been formed. It will be noted that the illustration in FIG. 6A is flipped upside-down with respect to the illustration of similar structures as shown in FIG. 1. The substrate 110 includes a core area 160 and a peripheral area 162 that is outside of the core area. The peripheral area 162 may, for example, be located along a peripheral edge of the substrate 110, although it will be understood that this is not a requirement. In an example implementation, the core area 160 may include photosensitive integrated circuits and the peripheral area 162 may include input/output (I/O) integrated circuits. The photosensitive integrated circuits are electrically connected to the I/O integrated circuits through the metal lines 124 and vias 126 of the metallization levels M1-Mn. Capacitive deep trench isolation (CDTI) structures 146 (also known in the art as metal-filled DTI) are used within both the core area 160 and the peripheral area 162. The CDTI structures 146 in the peripheral area 162, however, are not used to isolate an active region of the substrate 110 which integrated circuits are formed. Rather, the CDTI structures 146 in the peripheral area 162 are used to provide an electrical connection through the substrate 110 from the front side surface 114 to the back side surface 112. The CDTI structures 146 in the peripheral area 162 may be connected, for example, to the I/O integrated circuits through the metal lines 124 and vias 126 of the metallization levels M1-Mn.

Plan views of the front side surface 114 in the peripheral area 162 illustrating different arrangements for the CDTI structures 146 are shown in FIGS. 3A-3B.

Figure 6B:
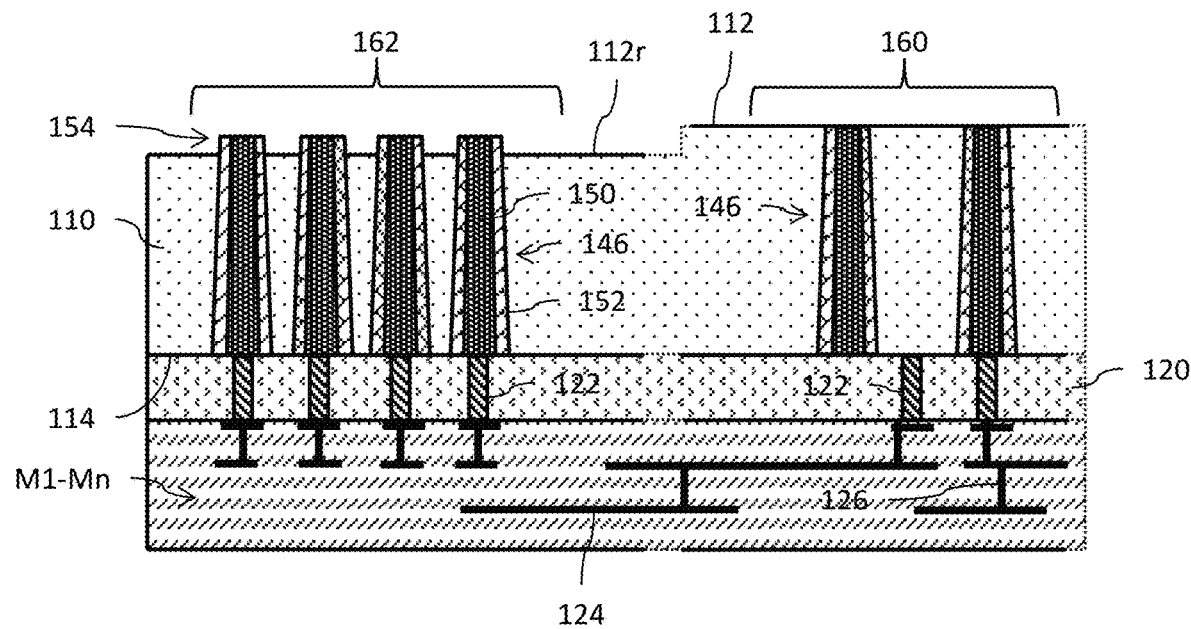

A substrate recess process is then performed on the back side surface 112. The substrate recess process is selective to remove semiconductor substrate material and reduce the thickness of the substrate 110. In an embodiment, the substrate recess process may comprise a selective (silicon) etch. The result of completion of the substrate recess process is shown in FIG. 6B. The implementation of the substrate recess process in FIG. 6B differs from that performed in connection with FIGS. 2B and 5B in that the recess occurs only within the peripheral area 162. Portions 154 of the CDTI structures 146 in the peripheral area 162 are exposed from the recessed back side surface 112r of the substrate 110. The substrate recess process may also remove some of the insulating liner 152. An end of the conductive region 150 is exposed.

Figure 6C:
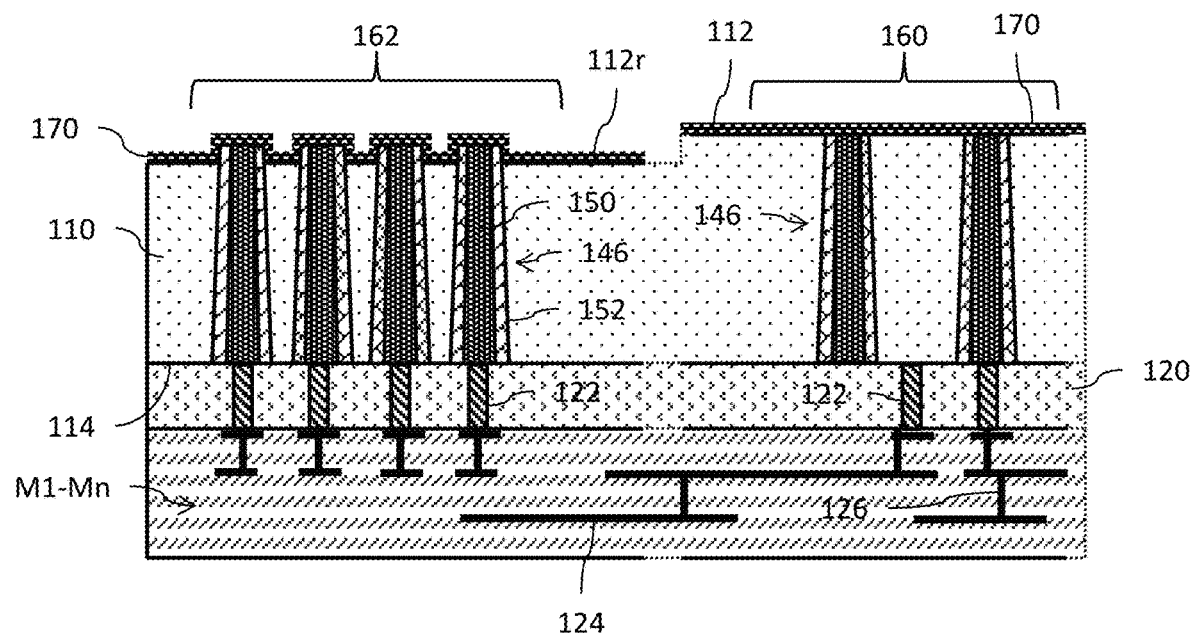

A conformal deposition is then made of a layer 170 of a high k dielectric material on the recessed back side surface 112r and the exposed portions 154 of the CDTI structures 146 in the peripheral area 162 and on the back side surface 112 in the core area 160. As an example, k>15 and the dielectric material may comprise $HfO_2$ or $Al_2O_3$. The deposition may use an ALD or (MO)CVD process. The result is shown in FIG. 6C.

Figure 6D:
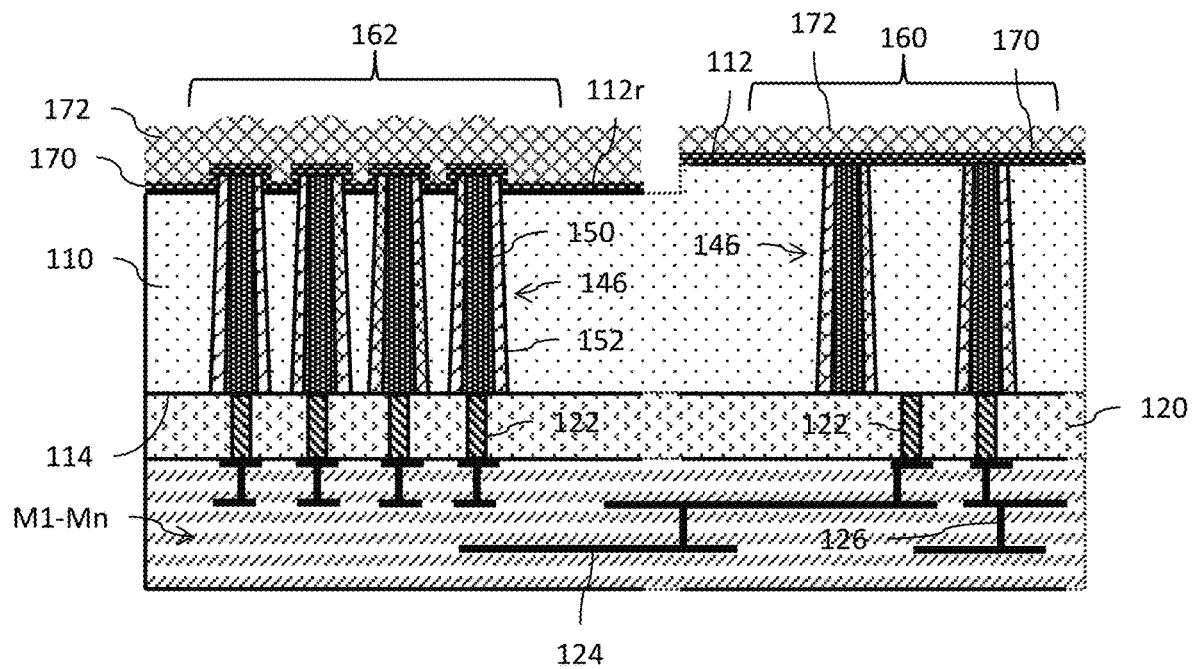

A deposition is then made of a layer 172 of an oxide material on the layer 170. As an example, the oxide material may comprise $SiO_2$ deposited using a PECVD process. The result is shown in FIG. 6D.

Figure 6E:
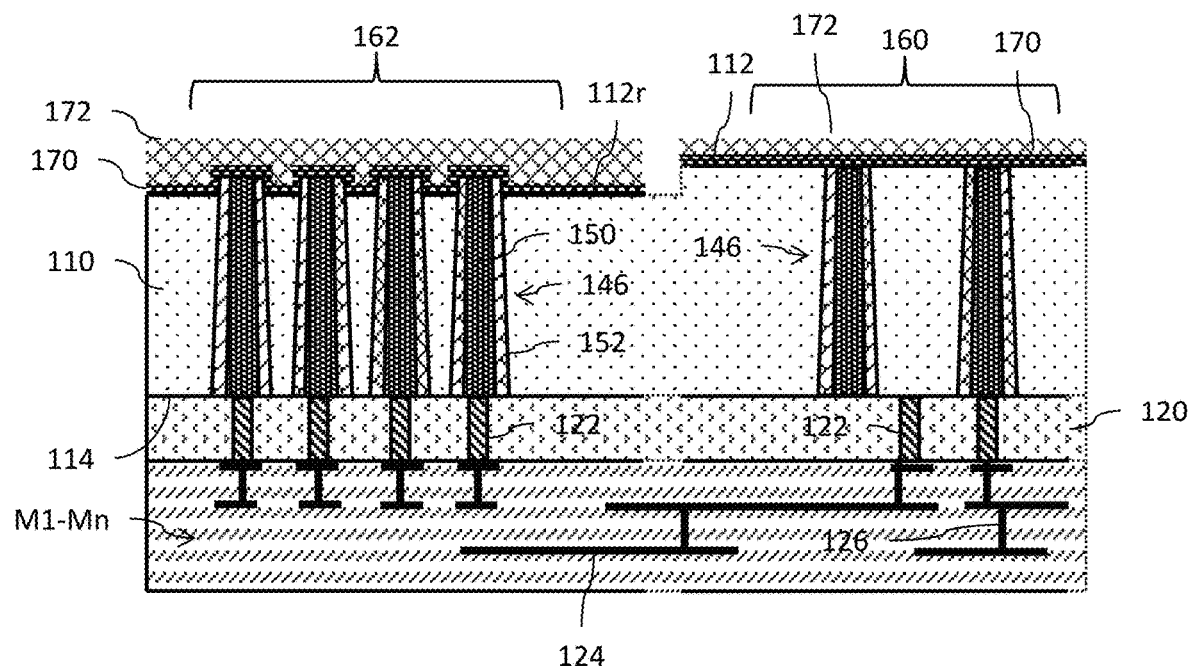

A chemical mechanical polish (CMP) is then performed on the layer 172. The result is shown in FIG. 6E.

Figure 6F:
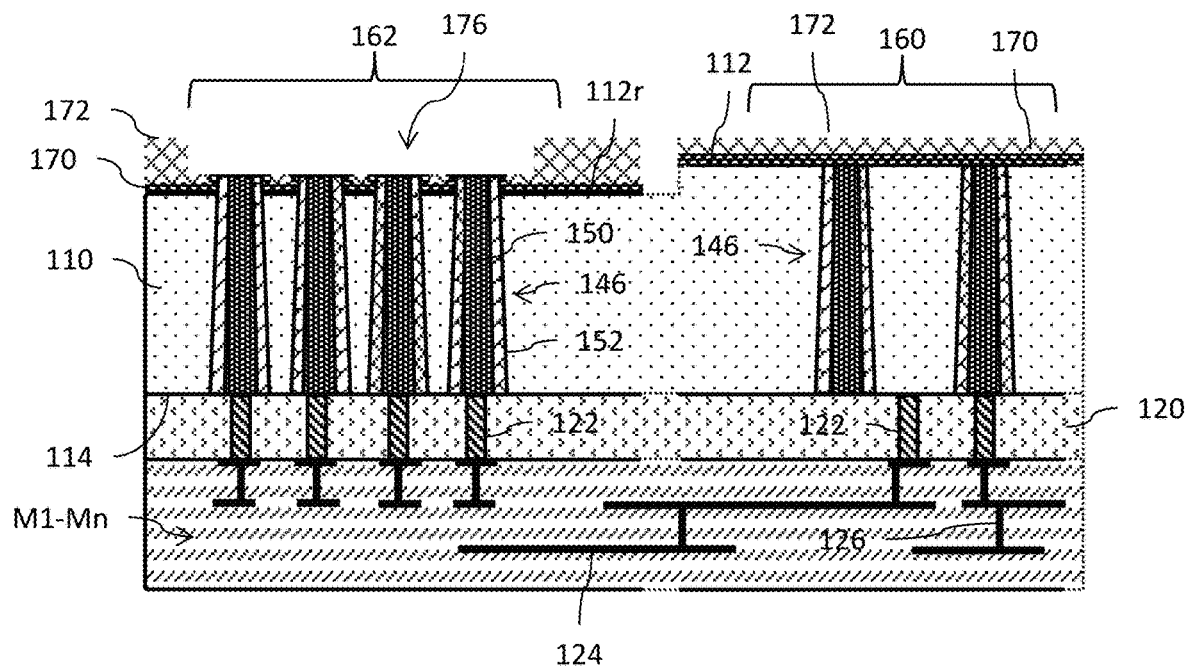

A mask (not shown) is formed on the polished surface using conventional lithographic masking techniques, and an etch is performed through the mask to open an aperture 176 in the layers 170 and 172 that exposes the ends of the portions 154 of the CDTI structures 146 in the peripheral area 162. As an example, the etch may comprise a standard dry etch process with selectivity with respect to the metal filling the CDTI. The result is shown in FIG. 6F.

Figure 6G:
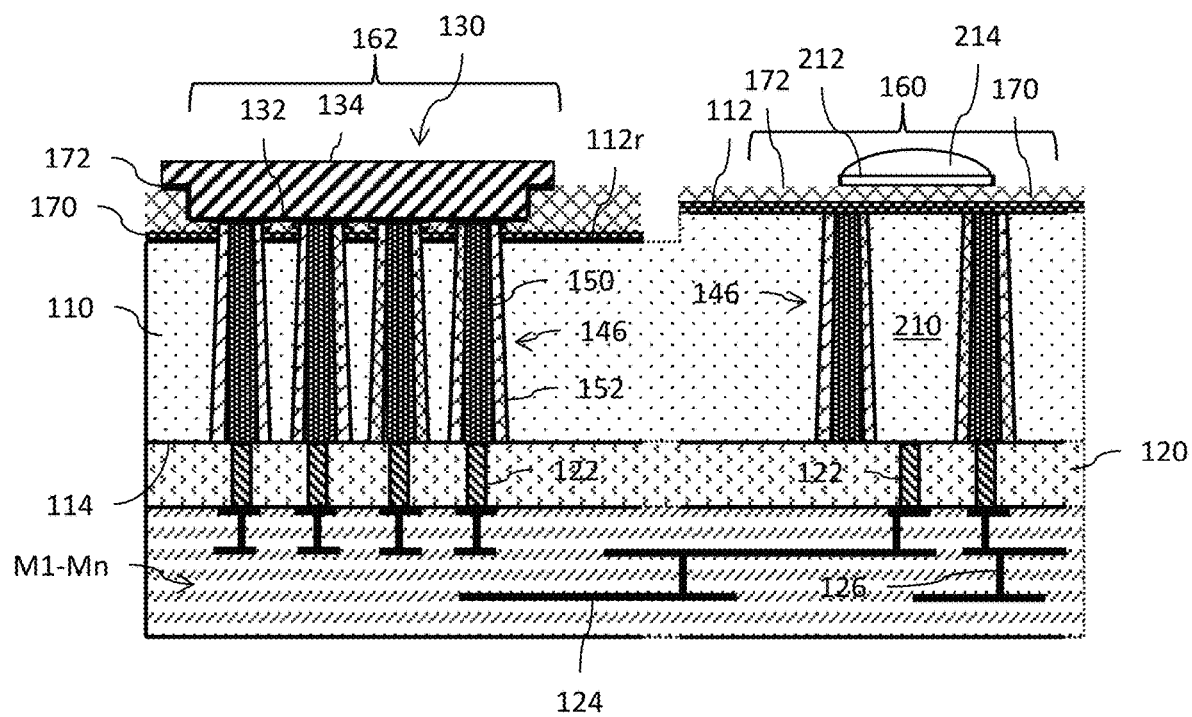

Conventional lithographic techniques are then used to pattern one or more metal material deposits to form a bonding pad 130 at least within the aperture 176. The bonding pad 130 may include a metal liner 132 and a metal block 134. The metal liner 132 may be made of Ti, TiN, Ta or TaN. The metal block 134 may be made of aluminum. With this configuration, the bonding pad 130 can be located at the recessed back side surface 112r and be electrically connected through the CDTI structures 146 in the peripheral area 162 and the contacts 122 to the metallization layers M1-Mn. The result is shown in FIG. 6G.

FIGS. 4A-4B show plan views in a direction of the recessed back side surface 112r in the peripheral area 162 which illustrates the relationship between the shape and area of the aperture 176, the shape and area of the bonding pad 130 and the shape and area of different arrangements for the pattern for the CDTI structures 146.

Reference is now made to FIGS. 7A-7E which show steps of a method for making an integrated circuit device where a back side bonding pad is electrically connected to front side metallization using capacitive deep trench isolation (CDTI) structures.

Figure 7A:
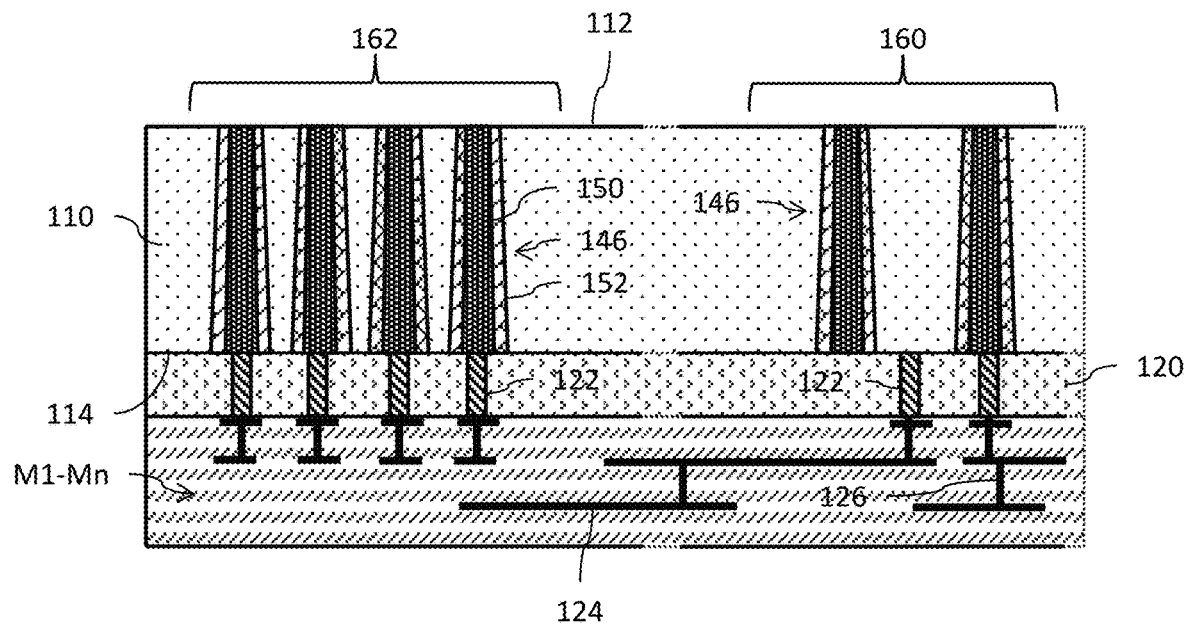
FIGS. 7A-7E show steps of a method for making an integrated circuit device where a back side bonding pad is electrically connected to front side metallization using CDTI structures.

FIG. 7A shows a cross section of the integrated circuit device at a point in time of the device fabrication process where: integrated circuits (not explicitly shown, see FIG. 1) have already been formed in and on the front side surface 114 of a semiconductor substrate 110 in active regions; the premetallization dielectric layer 120 has already been formed; the contacts 122 extending through the layer 120 have already been formed; and the metallization levels M1-Mn have already been formed. It will be noted that the illustration in FIG. 7A is flipped upside-down with respect to the illustration of similar structures as shown in FIG. 1. The substrate 110 includes a core area 160 and a peripheral area 162 that is outside of the core area. The peripheral area 162 may, for example, be located along a peripheral edge of the substrate 110, although it will be understood that this is not a requirement. In an example implementation, the core area 160 may include photosensitive integrated circuits and the peripheral area 162 may include input/output (I/O)

integrated circuits. The photosensitive integrated circuits are electrically connected to the I/O integrated circuits through the metal lines 124 and vias 126 of the metallization levels M1-Mn. Capacitive deep trench isolation (CDTI) structures 146 (also known in the art as metal-filled DTI) are used within both the core area 160 and the peripheral area 162. The CDTI structures 146 in the peripheral area 162, however, are not used to isolate an active region of the substrate 110 which integrated circuits are formed. Rather, the CDTI structures 146 in the peripheral area 162 are used to provide an electrical connection through the substrate 110 from the front side surface 114 to the back side surface 112. The back side surface 112 in this implementation is prepared, for example, through a chemical mechanical polish (CMP) that exposes the ends of the CDTI structures 146 (in particular, the conductive region 150). The CDTI structures 146 in the peripheral area 162 may be connected, for example, to the I/O integrated circuits through the metal lines 124 and vias 126 of the metallization levels M1-Mn.

Plan views of the front side surface 114 in the peripheral area 162 illustrating different arrangements for the CDTI structures 146 are shown in FIGS. 3A-3B.

Figure 7B:
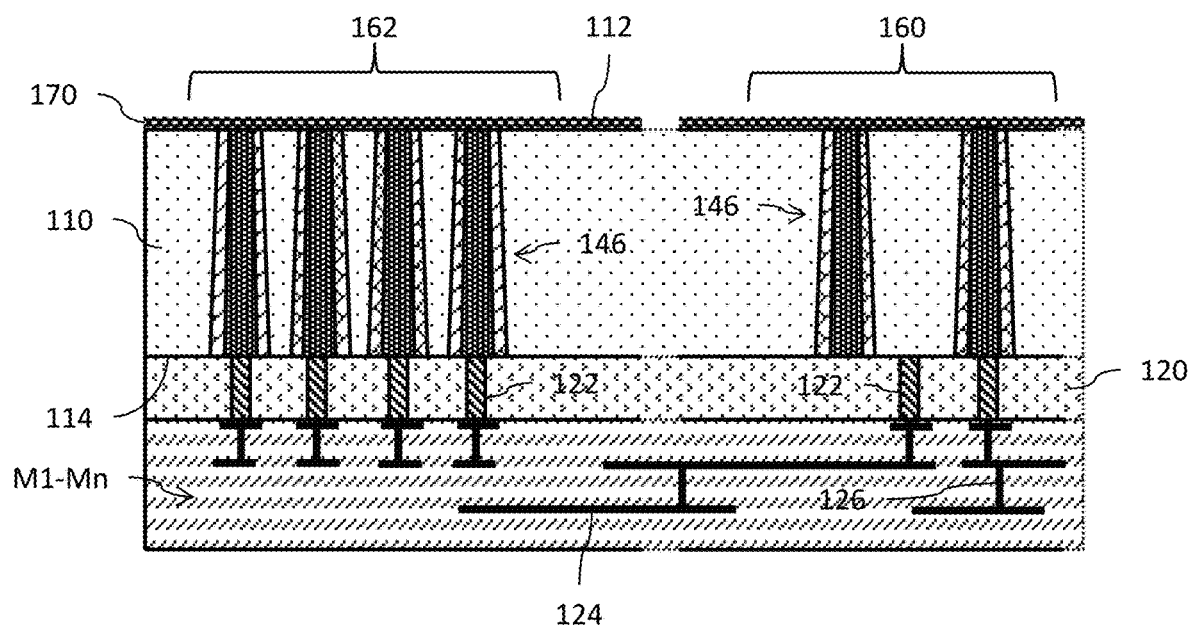

A conformal deposition is then made of a layer 170 of a high k dielectric material on the back side surface 112. As an example, k>15 and the dielectric material may comprise $HfO_2$ or $Al_2O_3$. The deposition may use an ALD or (MO) CVD process. The result is shown in FIG. 7B.

Figure 7C:
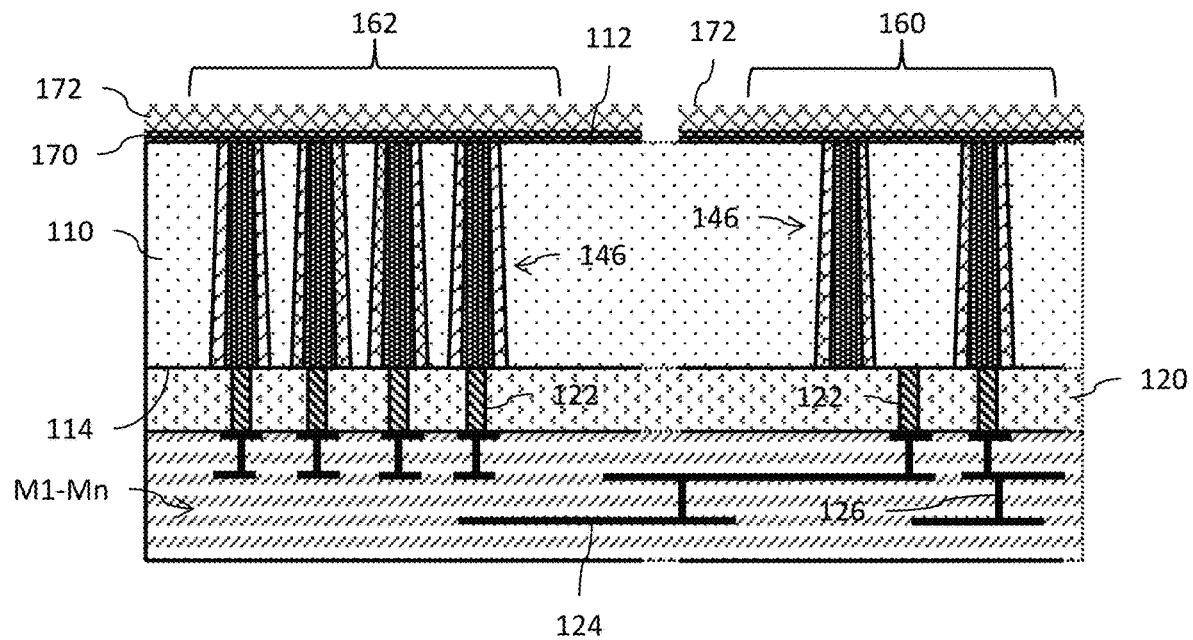

A deposition is then made of a layer 172 of an oxide material on the layer 170. As an example, the oxide material may comprise SiO2 deposited using a PECVD process. Optionally, a chemical mechanical polish (CMP) could be performed on the layer 172 if needed. The result is shown in FIG. 7C.

Figure 7D:
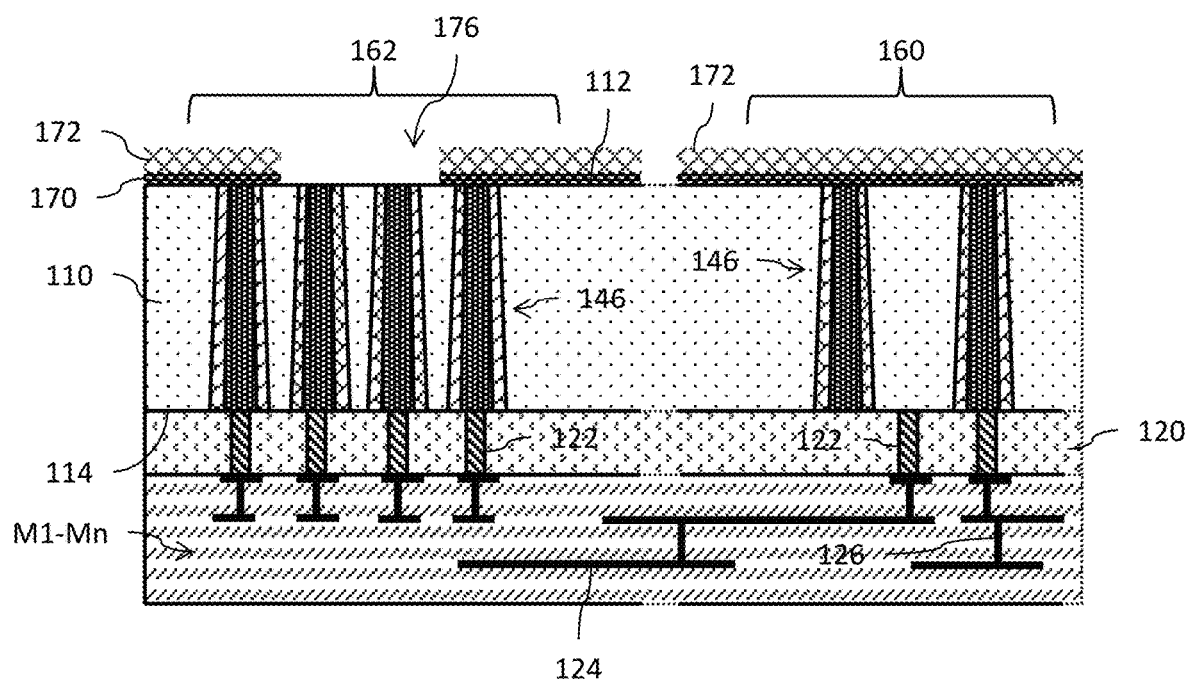

A mask (not shown) is formed on the polished surface using conventional lithographic masking techniques, and an etch is performed through the mask to open an aperture 176 in the layers 170 and 172 that exposes the ends of the CDTI structures 146 (and in particular the end of the conductive region 150) in the peripheral area 162. As an example, the etch may comprise a standard dry etch with selectivity with respect to the metal filling the CDTI. The result is shown in FIG. 7D. It will be noted that in this implementation only a subset of the ends of the CDTI structures 146 in the peripheral area 162 are exposed by the aperture 176. This is just an example, and in another implementation the ends of all of the CDTI structures 146 could be exposed (as shown with FIGS. 2F, 5F and 6F).

Figure 7E:
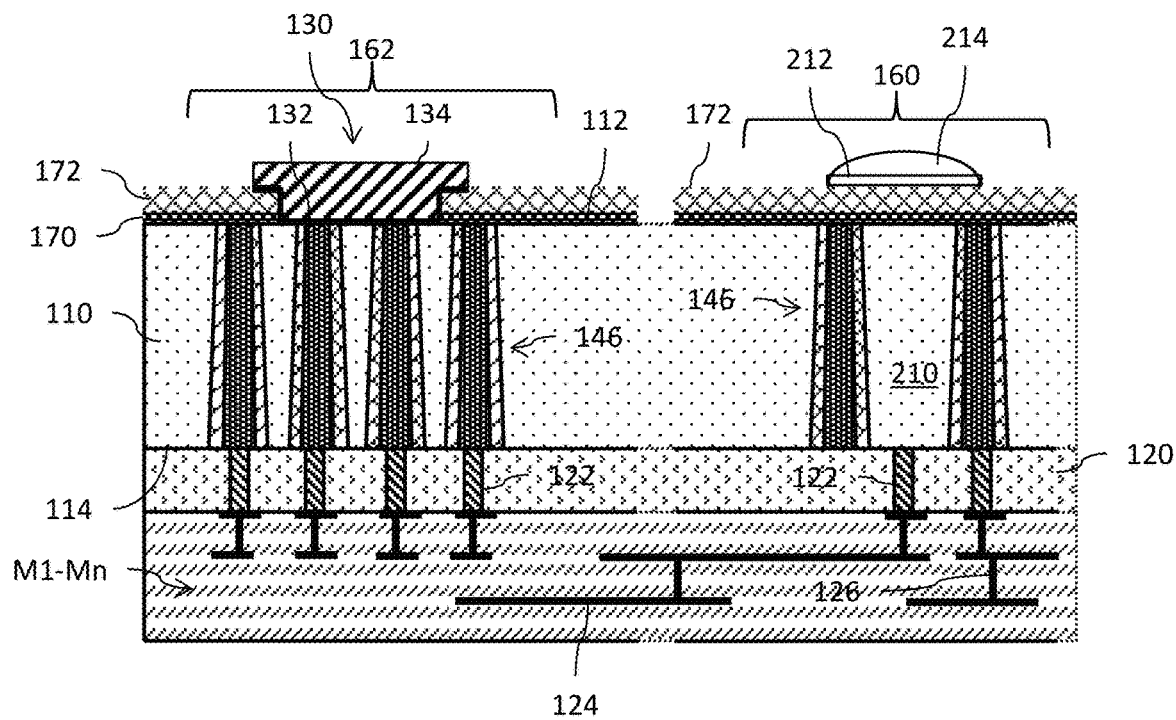

Conventional lithographic techniques are then used to pattern one or more metal material deposits to form a bonding pad 130 at least within the aperture 176. The bonding pad 130 may include a metal liner 132 and a metal block 134. The metal liner 132 may be made of Ti, TiN, Ta or TaN. The metal block 134 may be made of aluminum. With this configuration, the bonding pad 130 can be located at the back side surface 112 and be electrically connected through the CDTI structures 146 in the peripheral area 162 and the contacts 122 to the metallization layers M1-Mn. The result is shown in FIG. 7E.

Reference is now made to FIGS. 8A-8I which show steps of a method for making an integrated circuit device where a back side bonding pad is electrically connected to front side metallization using capacitive deep trench isolation (CDTI) structures.

Figure 8A:
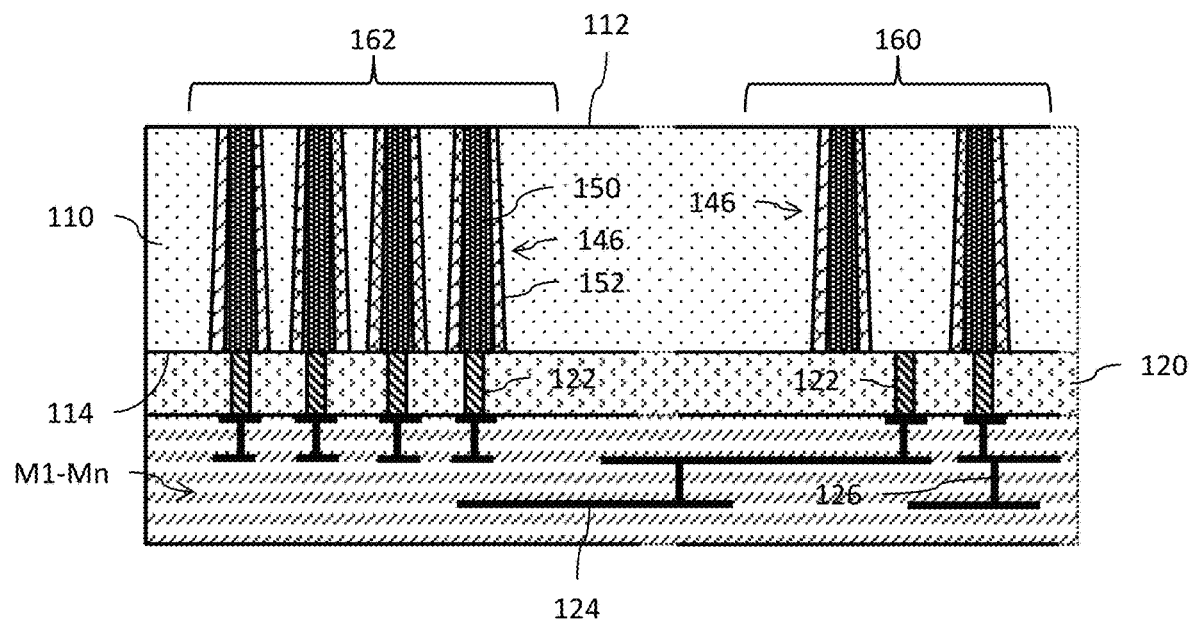
FIGS. 8A-8I show steps of a method for making an integrated circuit device where a back side bonding pad is electrically connected to front side metallization using CDTI structures.

FIG. 8A shows a cross section of the integrated circuit device at a point in time of the device fabrication process where: integrated circuits (not explicitly shown, see FIG. 1) have already been formed in and on the front side surface 114 of a semiconductor substrate 110 in active regions; the premetallization dielectric layer 120 has already been formed; the contacts 122 extending through the layer 120 have already been formed; and the metallization levels M1-Mn have already been formed. It will be noted that the illustration in FIG. 8A is flipped upside-down with respect to the illustration of similar structures as shown in FIG. 1. The substrate 110 includes a core area 160 and a peripheral area 162 that is outside of the core area. The peripheral area 162 may, for example, be located along a peripheral edge of the substrate 110, although it will be understood that this is not a requirement. In an example implementation, the core area 160 may include photosensitive integrated circuits and the peripheral area 162 may include input/output (I/O) integrated circuits. The photosensitive integrated circuits are electrically connected to the I/O integrated circuits through the metal lines 124 and vias 126 of the metallization levels M1-Mn. Capacitive deep trench isolation (CDTI) structures 146 (also known in the art as metal-filled DTI) are used within both the core area 160 and the peripheral area 162. The CDTI structures 146 in the peripheral area 162, however, are not used to isolate an active region of the substrate 110 which integrated circuits are formed. Rather, the CDTI structures 146 in the peripheral area 162 are used to provide an electrical connection through the substrate 110 from the front side surface 114 to the back side surface 112. The back side surface 112 in this implementation is prepared, for example, through a chemical mechanical polish (CMP) that exposes the ends of the CDTI structures 146 (in particular, the conductive region 150). The CDTI structures 146 in the peripheral area 162 may be connected, for example, to the I/O integrated circuits through the metal lines 124 and vias 126 of the metallization levels M1-Mn.

Plan views of the front side surface 114 in the peripheral area 162 illustrating different arrangements for the CDTI structures 146 are shown in FIGS. 3A-3B.

Figure 8B:
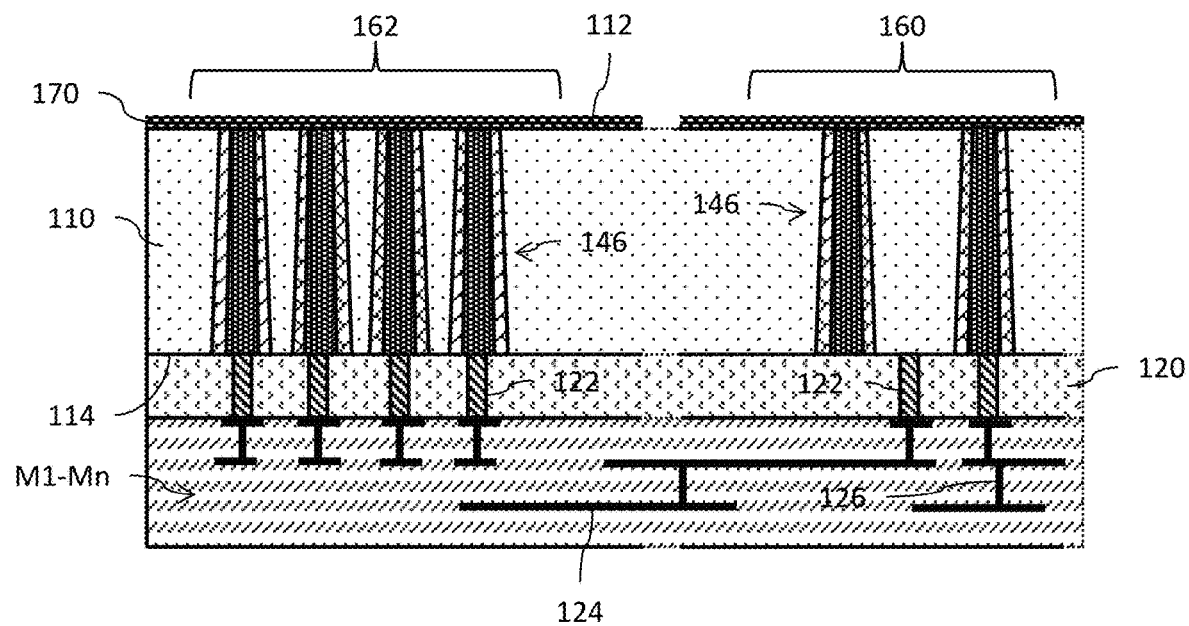

A conformal deposition is then made of a layer 170 of a high k dielectric material on the back side surface 112. As an example, k>15 and the dielectric material may comprise $HfO_2$ or $Al_2O_3$. The deposition may use an ALD or (MO) CVD process. The result is shown in FIG. 8B.

Figure 8C:
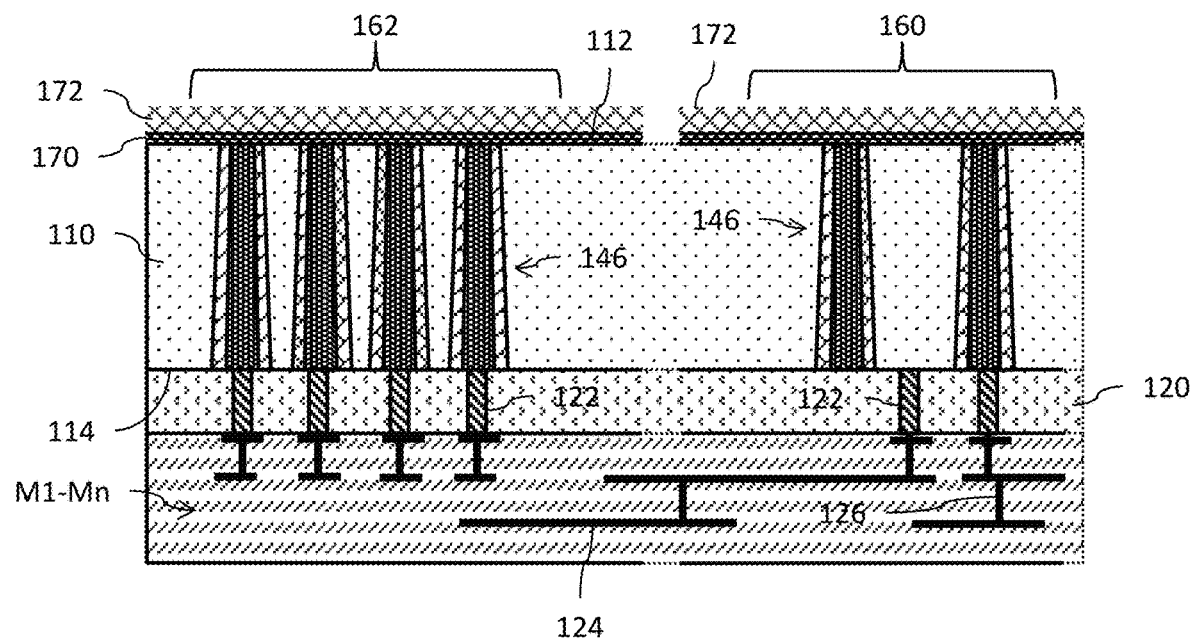

A deposition is then made of a layer 172 of an oxide material on the layer 170. As an example, the oxide material may comprise SiO2 deposited using a PECVD process. Optionally, a chemical mechanical polish (CMP) may be performed on the layer 172 if needed. The result is shown in FIG. 8C.

Figure 8D:
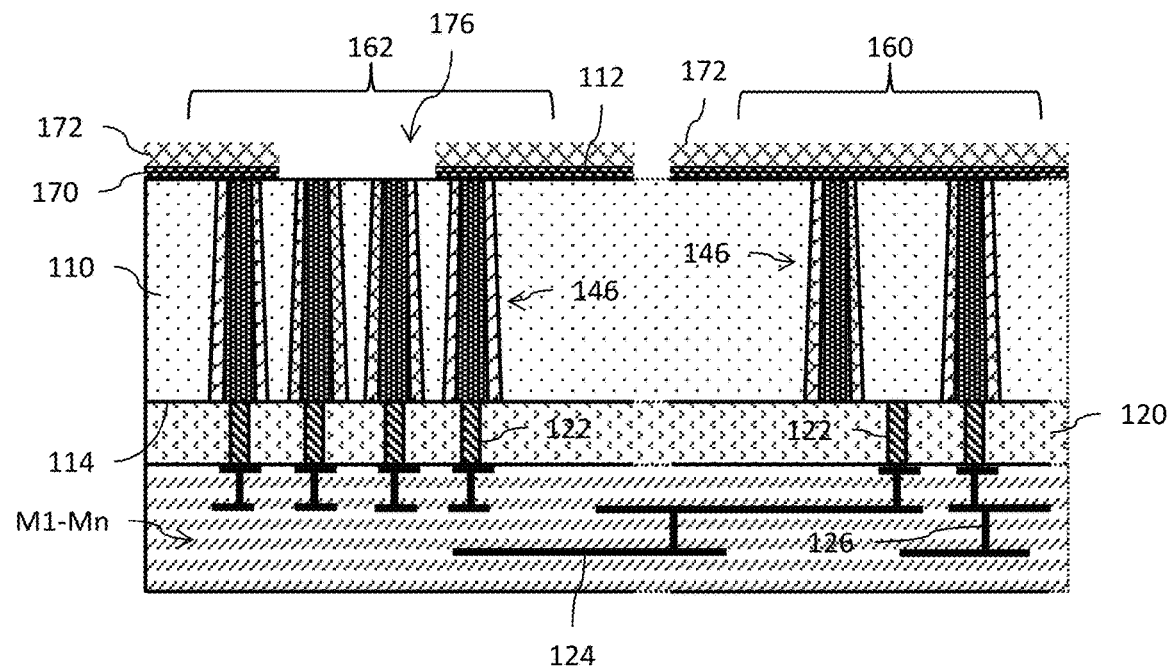

A mask (not shown) is formed on the polished surface using conventional lithographic masking techniques, and an etch is performed through the mask to open an aperture 176 in the layers 170 and 172 that exposes the ends of the CDTI structures 146 (and in particular the ends of the conductive regions 150) in the peripheral area 162. As an example, the etch may comprise a standard dry etch process with selectivity with respect to the metal filling the CDTI. The result is shown in FIG. 8D. It will be noted that in this implementation only a subset of the ends of the CDTI structures 146 in the peripheral area 162 are exposed by the aperture 176. This is just an example, and in another implementation the ends of all of the CDTI structures 146 could be exposed.

Figure 8E:
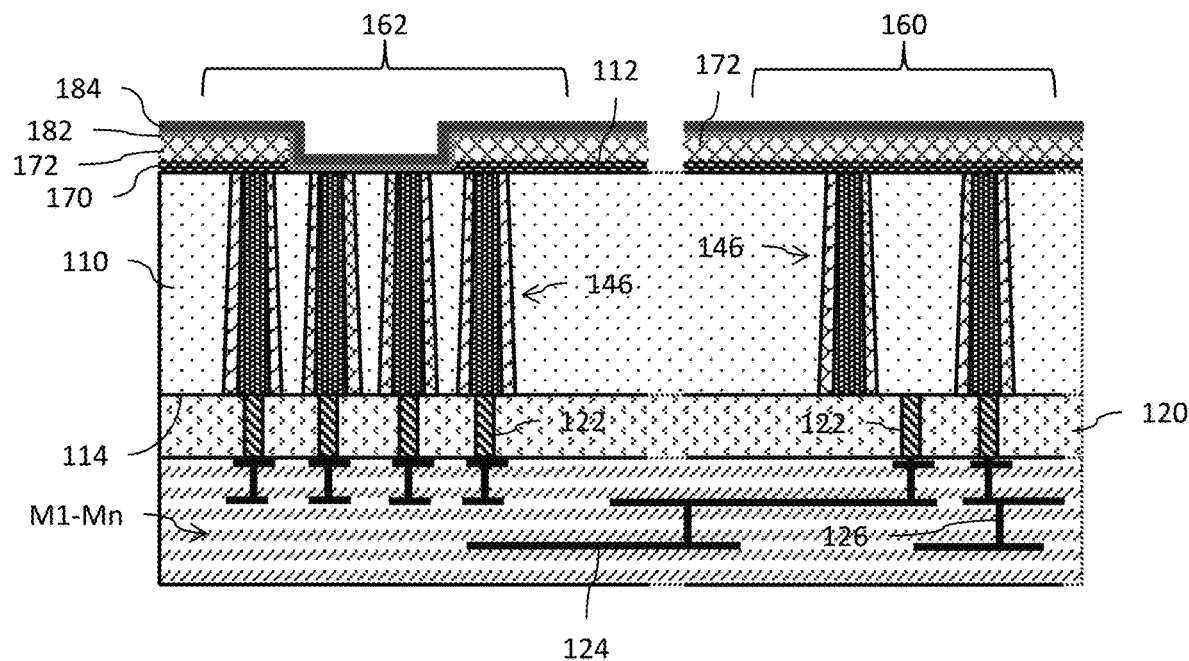

A conformal deposition is then made of a metal multi-layer on the layer 172, the multi-layer including a titanium-nitride (TiN) layer 182 and a tungsten (W) layer 184. The deposition may use a PVD process. The result is shown in FIG. 8E.

Figure 8F:
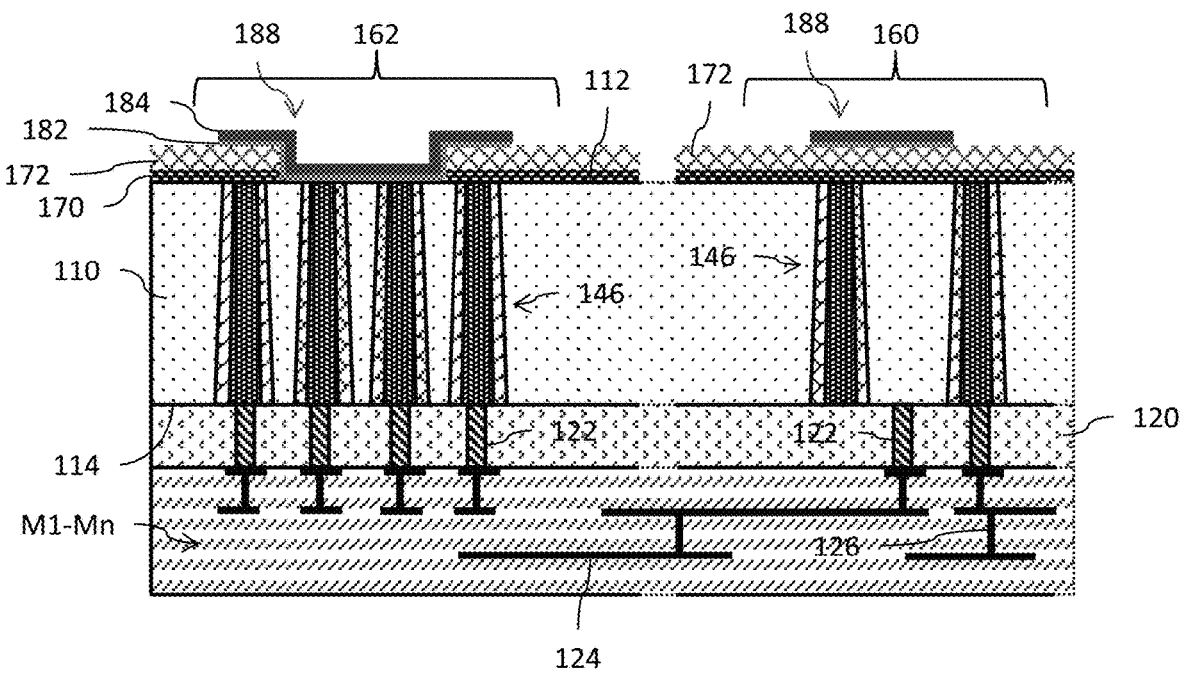

A mask (not shown) is formed on the layer 184 using conventional lithographic masking techniques, and an etch is performed through the mask to pattern the layer 184 to form a plurality of tungsten base structures 188. As an example, the etch may comprise a metal dry etch process. The result is shown in FIG. 8F. In this implementation, the tungsten can form not only the base for the contacting the CDTI structures but also form a light shield extending over portions of the substrate in the core area 160 which may be sensitive to light or other factors. The tungsten base structures 188 include a first structure associated with the location of the opening 176 and the plurality of CDTI structures 146 in the peripheral area 162 and a second structure associated with a location spaced apart therefrom, for example in the core area 160.

Figure 8G:
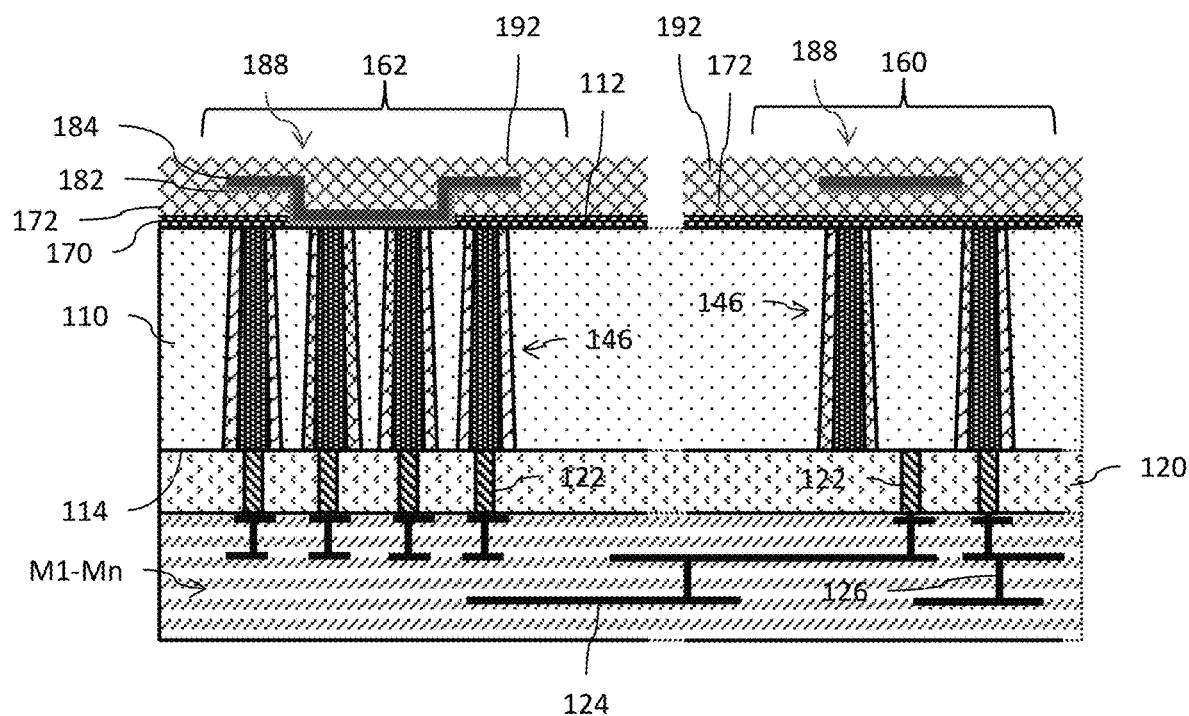

A deposition is then made of a layer 192 of an oxide material on the tungsten base structures 188 and the layer 182. As an example, the oxide material may comprise $SiO_2$ or other low index materials deposited using a PECVD process. A chemical mechanical polish (CMP) is then performed on the layer 192. The result is shown in FIG. 8G.

Figure 8H:
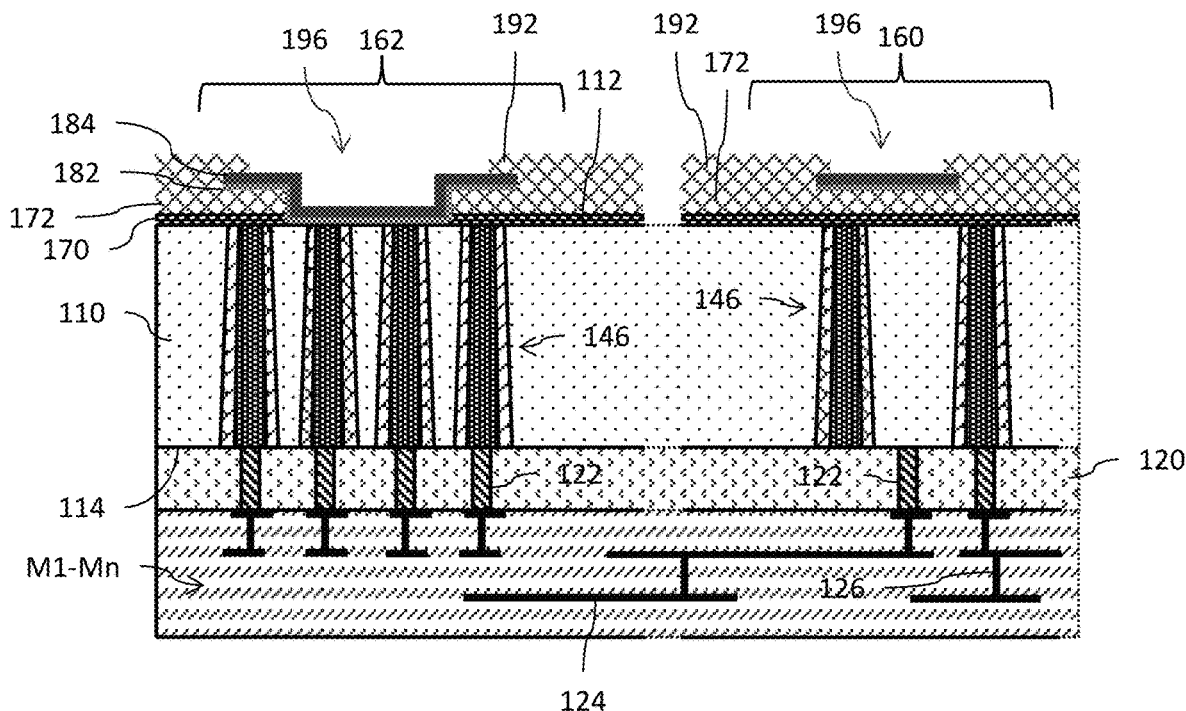

A mask (not shown) is formed on the polished surface using conventional lithographic masking techniques, and an etch is performed through the mask to open apertures 196 in the layer 192 that exposes the tungsten base structures 188. As an example, the etch may comprise a dry etch process. The result is shown in FIG. 8H.

Figure 8I:
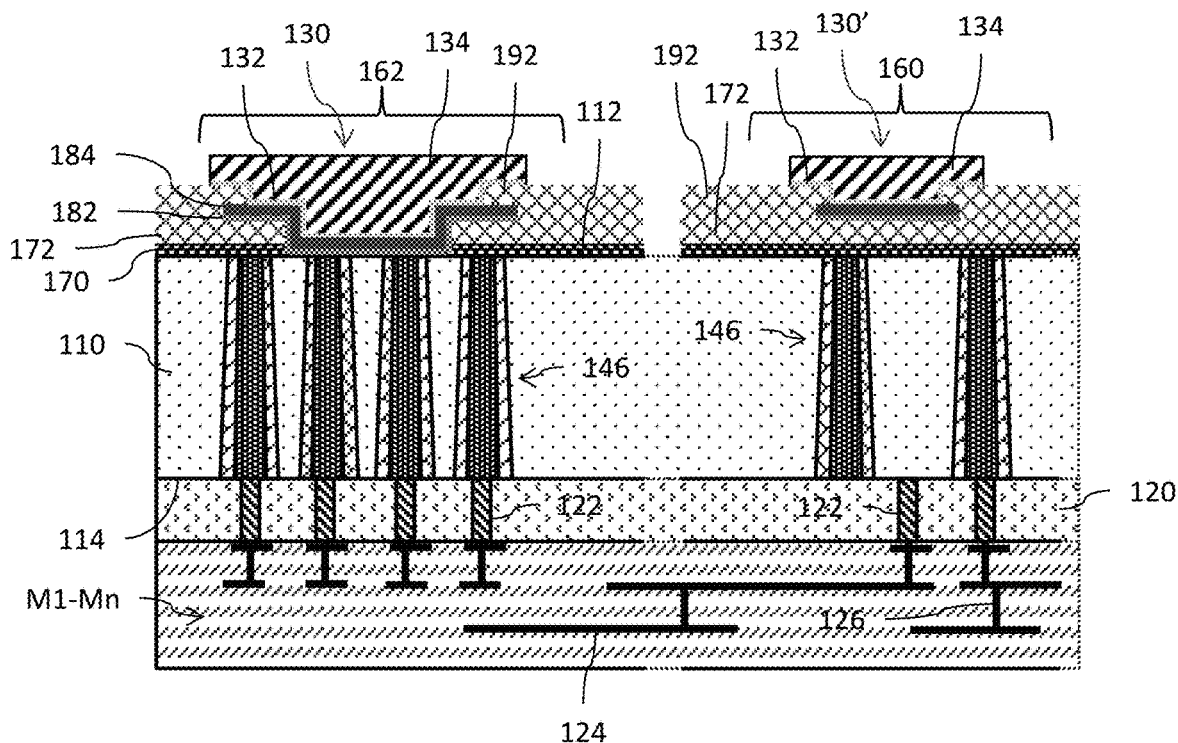

Conventional lithographic techniques are then used to pattern one or more metal material deposits to form bonding pads 130 and 130' at least within the apertures 196. The bonding pads 130, 130' may include a metal liner 132 and a metal block 134. The metal liner 132 may be made of Ti, TiN, Ta or TaN. The metal block 134 may be made of aluminum. With this configuration, the bonding pad 130 can be located at the back side surface 112 and be electrically connected through the CDTI structures 146 in the peripheral area 162 and the contacts 122 to the metallization layers M1-Mn. The bonding pad 130' may also be electrically connected to CDTI structures the metal routing lines. The result is shown in FIG. 8I.

Figure 8J:
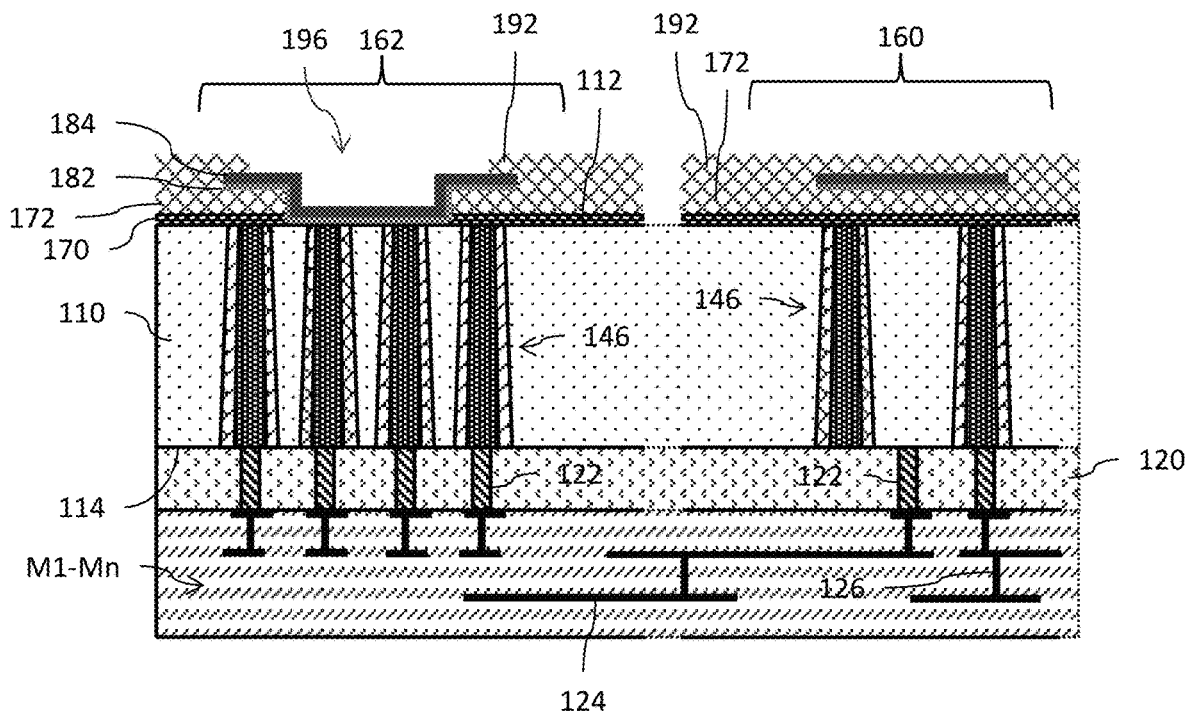
FIGS. 8J-8K show an alternative implementation.
Figure 8K:
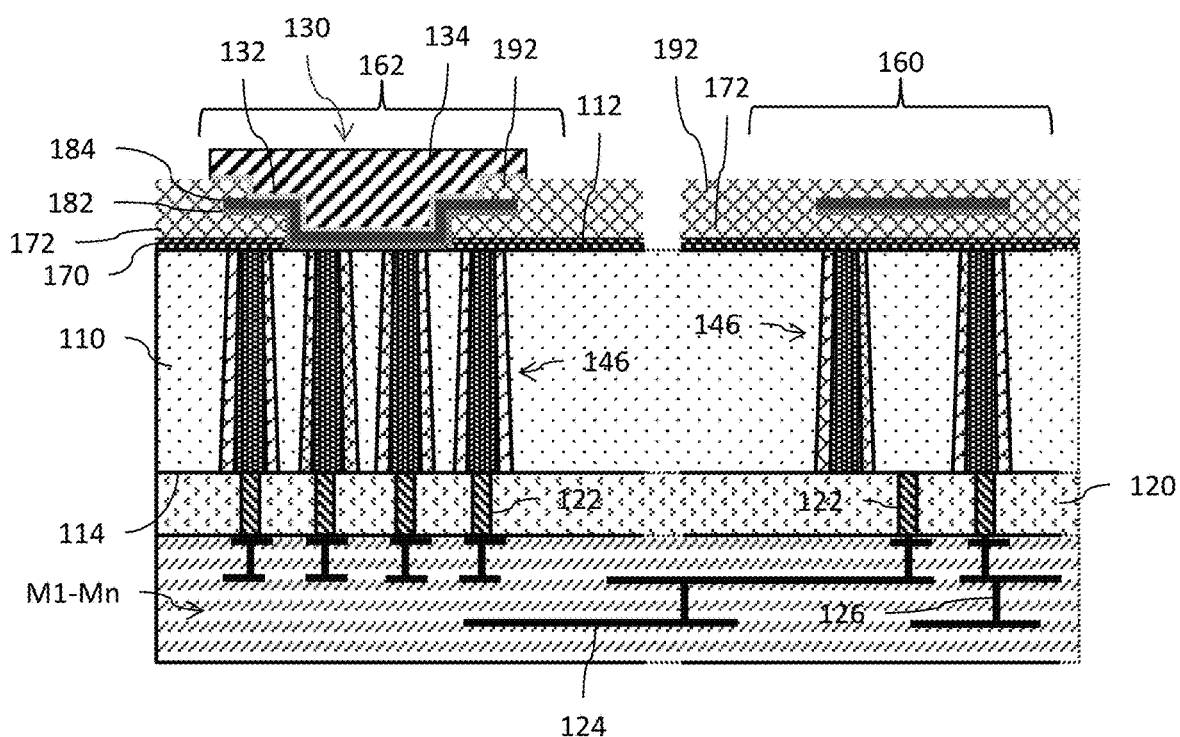

In an alternative implementation, as shown in FIGS. 8J and 8K, the aperture 196 is not formed over the tungsten base structures 188 located over the core area 160.

Figure 9:
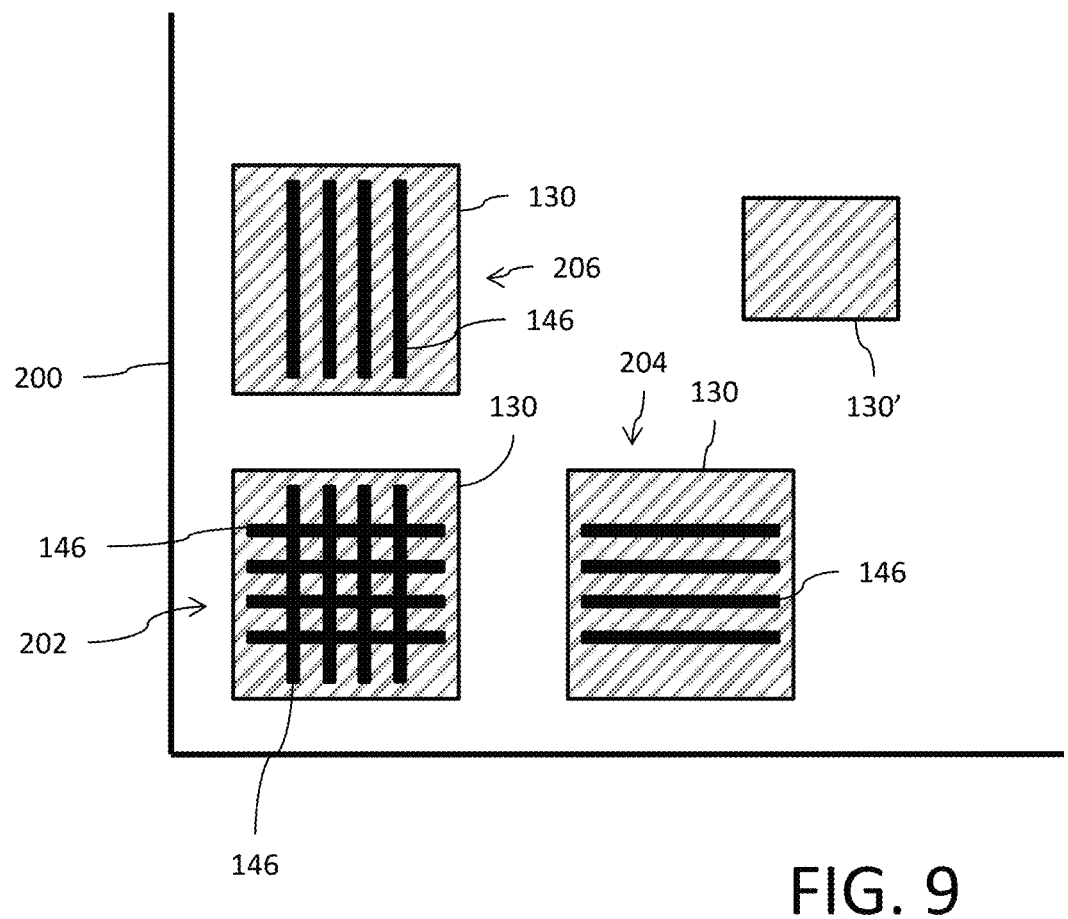
FIG. 9 shows a plan view of a back side of an integrated circuit device.

FIG. 9 shows a plan view of a back side of a small portion of an integrated circuit device formed using one of the methods disclosed herein. The bonding pads 130 are provided on the peripheral area 162 adjacent a perimeter edge 200. Each bonding pad 130 is associated with a plurality of CDTI structures 146. Reference 202 shows an implementation using an intersecting pattern of rows 54 and columns 56 for the CDTI structures 146. Reference 204 shows an implementation using a pattern of parallel rows 54 for the CDTI structures 146. Reference 206 shows an implementation using a pattern of parallel columns 56 for the CDTI structures 146.

As noted herein, the integrated circuits within the core area 160 may comprise photosensitive integrated circuits. For example, the core area 160 could include a plurality of such photosensitive integrated circuits arranged in rows and columns to form a pixel array. Each photosensitive integrated circuit may comprise a circuit of the back-side illumination (BSI) type which receives radiation through the back side of the integrate circuit chip. This is the same side of the integrated circuit chip where the bonding pads 130 are located. FIGS. 2G, 5G, 6G and 7E each illustrate such a configuration for the integrated circuit device where the CDTI structures 146 in the core area 160 delimit a photosensitive integrated circuit 210 and an optical filter 212 and optical lens 214 are provided on the back side in alignment with the of photosensitive integrated circuit 210. FIG. 8K shows also that certain light sensitive portions of the core area 160 can be optically shielded by the tungsten base structures 188. In yet another configuration, the shield provided by the tungsten base structures 188 in the core area 160 may be an electromagnetic shield.

It will further be understood that the provision of tungsten base structures 188 is equally applicable in the implementations of the process as shown in FIGS. 2F, 5F, 6F and 7D. In each case, the process shown in FIGS. 8E-8K would be implemented to replace the process shown in FIGS. 2G, 5G, 6G and 7E.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    forming a plurality of capacitive deep trench isolation structures extending completely through a semiconductor substrate from a front side surface to a back side surface, each capacitive deep trench isolation structure comprising a conductive region insulated from the semiconductor substrate by an insulating liner;
    providing a metallization structure at the front side surface of the semiconductor substrate that is electrically connected to first ends of the plurality of capacitive deep trench isolation structures;
    recessing the back side surface of the semiconductor substrate to expose second ends of the plurality of capacitive deep trench isolation structures; and
    forming a bonding pad structure adjacent the recessed back side surface of the semiconductor substrate, wherein the bonding pad structure is directly physically and electrically connected to the conductive regions at the second ends of the plurality of capacitive deep trench isolation structures and electrically insulated from the semiconductor substrate, wherein forming the bonding pad structure comprises:
        depositing a conformal layer of a dielectric material on the recessed back side surface and exposed second ends of the plurality of capacitive deep trench isolation structures;
        depositing a conformal layer of an oxide material on the layer of the dielectric material;
        planarizing the layer of the oxide material;
        opening an aperture extending through at least the layer of the dielectric material which extends on end surfaces of the plurality of capacitive deep trench isolation structures to expose the conductive regions at the second ends of the plurality of capacitive deep trench isolation structures; and
        depositing one or more metal materials forming the bonding pad structure within said aperture.

2. The method of claim 1, wherein planarizing the layer of oxide material comprises stopping planarization at the layer of the dielectric material, and wherein opening the aperture comprises opening the aperture to extend through the layer of the dielectric material.

3. The method of claim 1, wherein planarizing the layer of the oxide material comprises stopping planarization before reaching the layer of the dielectric material, and wherein opening the aperture comprises opening the aperture to extend through both the layer of the oxide material and the layer of the dielectric material.

4. The method of claim 1, wherein the semiconductor substrate includes a core area and a peripheral area, and wherein recessing the back side surface of the semiconductor substrate is performed in the peripheral area but not in the core area.

5. A method, comprising:
   forming a plurality of capacitive deep trench isolation structures extending completely through a semiconductor substrate from a front side surface to a back side surface, each capacitive deep trench isolation structure comprising a conductive region insulated from the semiconductor substrate by an insulating liner;
   providing a metallization structure at the front side surface of the semiconductor substrate that is electrically connected to first ends of the plurality of capacitive deep trench isolation structures;
   recessing the back side surface of the semiconductor substrate to expose second ends of first capacitive deep trench isolation structures of said plurality of capacitive deep trench isolation structures; and
   forming a bonding pad structure adjacent the recessed back side surface of the semiconductor substrate, wherein the bonding pad structure is directly physically and electrically connected to the conductive regions at the second ends of the first capacitive deep trench isolation structures and electrically insulated from the semiconductor substrate, wherein forming the bonding pad structure comprises:
      depositing a conformal layer of a dielectric material on the recessed back side surface and exposed second ends of the first capacitive deep trench isolation structures;
      depositing a conformal layer of an oxide material on the layer of the dielectric material;
      planarizing the layer of the oxide material;
      opening an aperture extending through at least the layer of the dielectric material which extends on end surfaces of the first capacitive deep trench isolation structures to expose the conductive regions at the second ends of the first capacitive deep trench isolation structures; and
      depositing one or more metal materials forming the bonding pad structure within said aperture.

6. The method of claim 5, wherein planarizing the layer of the oxide material comprises stopping planarization at the layer of the dielectric material, and wherein opening the aperture comprises opening the aperture to extend through the layer of the dielectric material.

7. The method of claim 5, wherein planarizing the layer of the oxide material comprises stopping planarization before reaching the layer of the dielectric material, and wherein opening the aperture comprises opening the aperture to extend through both the layer of the oxide material and the layer of the dielectric material.

8. The method of claim 5, wherein the semiconductor substrate includes a core area and a peripheral area, wherein said first capacitive deep trench isolation structures are located in the peripheral area, said plurality of capacitive deep trench isolation structures further including second capacitive deep trench isolation structures located in the core area, and wherein recessing the back side surface of the semiconductor substrate is performed in the peripheral area but not in the core area.

9. The method of claim 8, further comprising forming a photosensitive circuit in the core area of the semiconductor substrate, said photosensitive circuit delimited by said second capacitive deep trench isolation structures.

10. The method of claim 9, further comprising placing a lens over the photosensitive circuit above the planarized layer of the oxide material.

11. The method of claim 5, wherein the semiconductor substrate includes a core area and a peripheral area, wherein said first capacitive deep trench isolation structures are located in the peripheral area, said plurality of capacitive deep trench isolation structures further including second capacitive deep trench isolation structures located in the core area, and wherein recessing the back side surface of the semiconductor substrate is performed in both the peripheral area and the core area so as to expose second ends of the second capacitive deep trench isolation structures.

12. The method of claim 11, wherein the layer of the dielectric material is deposited on the exposed second ends of the second capacitive deep trench isolation structures, and wherein forming the bonding pad structure further comprises:
   opening a further aperture extending through at least the layer of the dielectric material which extends on end surfaces of the plurality of capacitive deep trench isolation structures to expose the conductive regions at the second ends of the first capacitive deep trench isolation structures; and
   depositing one or more metal materials forming the bonding pad structure within said further aperture.

13. The method of claim 12, wherein planarizing the layer of the oxide material comprises stopping planarization at the layer of the dielectric material, and wherein opening the aperture comprises opening the aperture to extend through the layer of the dielectric material.

14. The method of claim 12, wherein planarizing the layer of the oxide material comprises stopping planarization before reaching the layer of the dielectric material, and wherein opening the aperture comprises opening the aperture to extend through both the layer of the oxide material and the layer of the dielectric material.

15. The method of claim 11, further comprising forming a photosensitive circuit in the core area of the semiconductor substrate, said photosensitive circuit delimited by said second capacitive deep trench isolation structures.

16. The method of claim 15, further comprising placing a lens over the photosensitive circuit above the planarized layer of the oxide material.

* * * * *